(12) United States Patent
Massler et al.

(10) Patent No.: US 7,160,616 B2
(45) Date of Patent: Jan. 9, 2007

(54) DLC LAYER SYSTEM AND METHOD FOR PRODUCING SAID LAYER SYSTEM

(75) Inventors: Orlaw Massler, Feldkirch (AT); Mauro Pedrazzini, Eschen (LI); Christian Wohlrab, Feldkirch (AT); Hubert Eberle, Balzers (LI); Martin Grischke, Schaan (LI); Thorsten Michler, Mainz (DE)

(73) Assignee: OC Oerlikon Balzers Ltd., Fuerstentum (LI)

( * ) Notice: Subject to any disclaimer, the term of this patent is extended or adjusted under 35 U.S.C. 154(b) by 0 days.

(21) Appl. No.: 10/257,678

(22) PCT Filed: Dec. 27, 2000

(86) PCT No.: PCT/EP00/13299

§ 371 (c)(1),
(2), (4) Date: Aug. 1, 2003

(87) PCT Pub. No.: WO01/79585

PCT Pub. Date: Oct. 25, 2001

(65) Prior Publication Data

US 2004/0038033 A1 Feb. 26, 2004

(30) Foreign Application Priority Data

Apr. 12, 2000 (DE) .............................. 100 18 143

(51) Int. Cl.
*C23C 16/26* (2006.01)

(52) U.S. Cl. ............ 428/408; 204/192.38; 204/298.41; 427/249.1; 427/249.7; 427/577; 428/216; 428/325; 428/336; 428/698

(58) Field of Classification Search ................ 428/408, 428/696, 212, 216, 336, 325; 427/249.7, 427/249.1, 577, 569, 571; 204/192.38, 298.41
See application file for complete search history.

(56) References Cited

U.S. PATENT DOCUMENTS

| 4,486,286 | A | * | 12/1984 | Lewin et al. | .......... 204/192.11 |
|---|---|---|---|---|---|
| 4,698,256 | A | * | 10/1987 | Giglia et al. | ................. 428/216 |
| 4,749,587 | A | * | 6/1988 | Bergmann et al. | .......... 427/570 |
| 4,869,923 | A | * | 9/1989 | Yamazaki | .................... 427/571 |
| 4,877,677 | A | * | 10/1989 | Hirochi et al. | .............. 428/216 |
| 4,919,974 | A | * | 4/1990 | McCune et al. | ......... 427/249.7 |
| 4,992,153 | A | | 2/1991 | Bergmann et al. | |
| 4,996,079 | A | * | 2/1991 | Itoh | ........................... 427/570 |
| 5,013,579 | A | * | 5/1991 | Yamazaki | .................... 427/571 |
| 5,147,687 | A | * | 9/1992 | Garg et al. | ............ 427/249.11 |
| 5,237,967 | A | * | 8/1993 | Willermet et al. | .......... 428/408 |
| 5,306,408 | A | * | 4/1994 | Treglio | .................. 204/192.38 |
| 5,411,797 | A | * | 5/1995 | Davanloo et al. | ........... 428/336 |
| 5,523,121 | A | * | 6/1996 | Anthony et al. | ........ 427/249.11 |
| 5,562,982 | A | * | 10/1996 | Hiwatashi | .................... 428/332 |
| 5,626,922 | A | * | 5/1997 | Miyanaga et al. | ..... 427/255.31 |
| 5,629,086 | A | | 5/1997 | Hirano et al. | |
| 5,637,373 | A | * | 6/1997 | Hayashi | ...................... 428/408 |
| 5,688,557 | A | * | 11/1997 | Lemelson et al. | ..... 427/249.14 |
| 5,707,748 | A | * | 1/1998 | Bergmann | .................. 428/698 |
| 5,709,784 | A | | 1/1998 | Braendle et al. | |
| 5,750,210 | A | | 5/1998 | Schmidt et al. | |
| 5,768,046 | A | | 6/1998 | Lee et al. | |
| 5,942,317 | A | * | 8/1999 | White | ........................ 428/216 |
| 6,066,399 | A | | 5/2000 | Hirano et al. | |

FOREIGN PATENT DOCUMENTS

| DE | 19513614 | 10/1996 |
|---|---|---|
| EP | 0229936 | 7/1987 |
| EP | 0577 246 | 1/1994 |
| EP | 0579983 | 1/1994 |
| EP | 0600533 | 6/1994 |
| FR | 2596775 | 10/1987 |
| JP | 62188776 | 8/1987 |
| JP | 10137861 | 5/1998 |

OTHER PUBLICATIONS

Copy of Search Report.

* cited by examiner

*Primary Examiner*—Archene Turner
(74) *Attorney, Agent, or Firm*—Crowell & Moring LLP Photograph of a transverse fracture of a layer produced in accordance with the invention

(57) ABSTRACT

The invention describes a device and a process that render possible the production of a layer system for wear protection, corrosion protection and improvement of the slipping properties and the like with an adhesion layer to be arranged on a substrate, a transition layer to be arranged on the adhesion layer and a covering layer of diamond-like carbon, wherein the adhesion layer comprises at least one element of the group of elements that contains the elements of the fourth, fifth and sixth subgroup of the periodic table and silicon, the transition layer comprises carbon and at least one element of the aforesaid groups and covering layer consists essentially of diamond-like carbon, the layer system having a hardness of at least 15 GPa, preferably at least 20 GPa, and an adhesion of at least 3 HF according to VDI 3821, Sheet 4.

Figure 1:
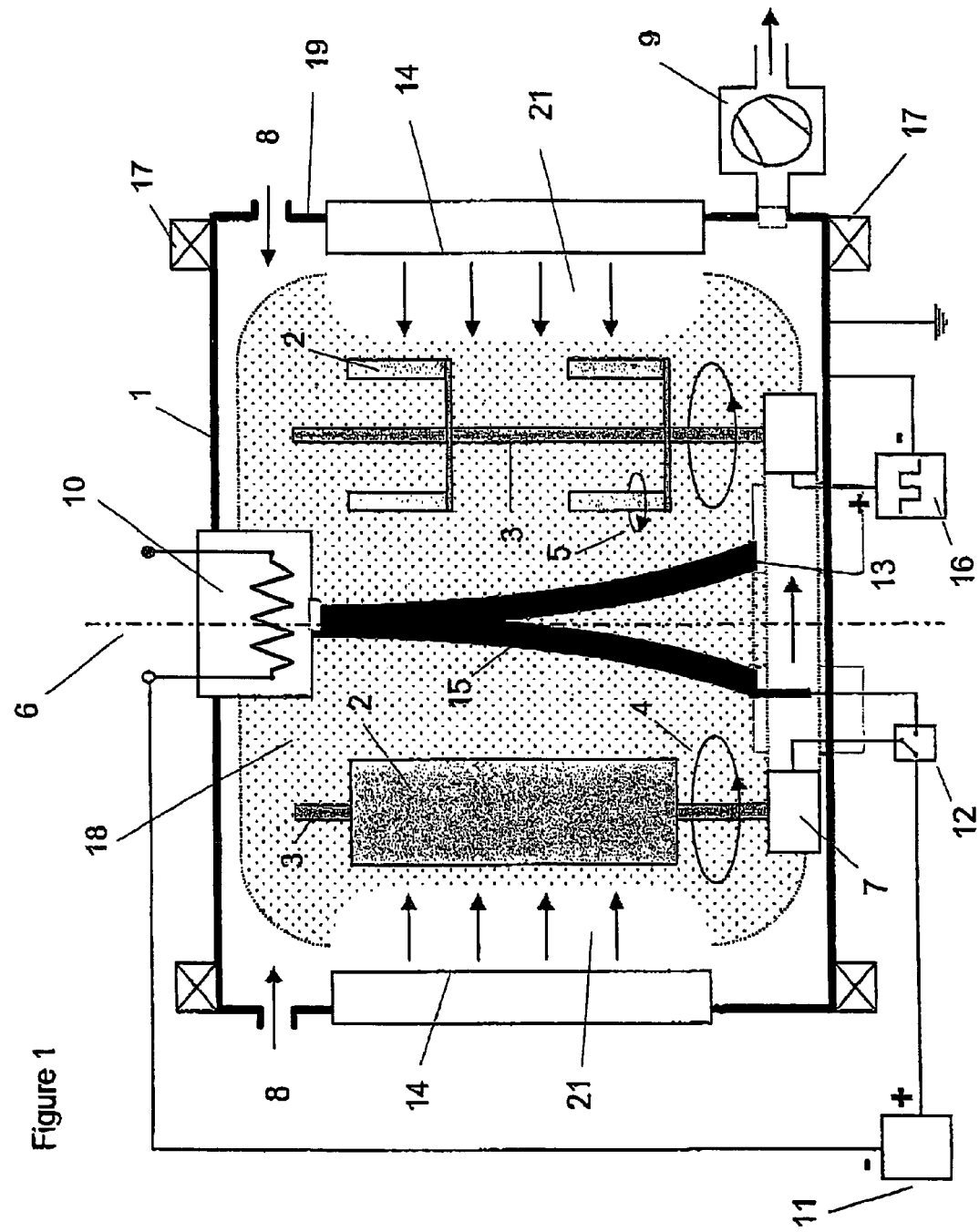

The process used for the production of this layer system is such at the initial introduction of the substrate into a vacuum chamber and pumping to produce a vacuum of at least $10^{-4}$ mbar, preferably $10^{-5}$ mbar, is at first followed by the cleaning of the substrate surface to remove any adhering impurities and then by the plasma-supported deposition of the adhesion layer. Subsequently the transition layer is applied by the simultaneous deposition of the components of the adhesion layer and the deposition of carbon from the gaseous phase by means of plasma-CVD. The diamond-like carbon layer is then applied solely by means of plasma-supported deposition of carbon from the gaseous phase. During the process a biasing voltage is applied to the substrate, this voltage being pulsed in the medium-frequency range, while a superposed magnetic field stabilizes the plasma in the individual process steps.

An appropriate device for carrying out the coating process therefore consists of a vacuum chamber (1) with a pumping system (9) for the production of a vacuum in the vacuum chamber, substrate holding devices (3) to receive the substrates to be coated, at least one gas supply unit (18) for dosing the supply of process gas, at least one vaporizer device (14) to make available coating material for deposition, an arc generation device (10, 13) to ignite a low-voltage d.c. arc, a device (16) for the generation of a substrate biasing voltage and with at least one or several magnetic field generator devices (17) for the formation of a far magnetic field.

The invention also describes a DLC-slipping layer system and a process for the production of such a system, which on its surface side is provided with an an additional slipping layer.

35 Claims, 11 Drawing Sheets

Photograph of a transverse fracture of a layer produced in accordance with the invention

DLC LAYER SYSTEM AND METHOD FOR PRODUCING SAID LAYER SYSTEM

The present invention concerns a layer system in accordance claim 1, a process in accordance claim 21 and a device in accordance with claim 41. Preferred embodiments of the invention are disclosed in dependent claims 2 to 22, 22 to 39 and 41, as also in the description, examples and drawings.

Notwithstanding the outstanding properties of diamond-like carbon layers (DLC layers), which include great hardness and excellent slipping properties, and many years of worldwide research activities, it has not so far proved possible to produce any pure DLC layers that—even in the case of more substantial layer thicknesses (>1 μm)—have a layer adhesion sufficient for industrial use in typical wear protection applications and also have a sufficient conductivity to avoid the high-frequency (HF) process for their production and the many difficulties associated therewith.

Among the typical wear protection applications mention may here be made not only of applications in connection with machine construction, among them protection against sliding wear, pitting, cold bonding, etc., especially machine parts that move with respect to each other, such as, for example, gear wheels, pump and moulding die (cup) rams, piston rings, injection needles, complete bearings or their individual components, and various others, but also applications in the material processing sector for the protection of the tools employed for chipping or cold working and in die casting.

Apart from these many-sided application possibilities in connection with wear protection, express mention should here be made also of corrosion protection as another highly promising area in which such DLC layers may be used.

Pure DLC layers, given their high internal stresses and the rather problematical adhesion that is associated therewith, especially when highly stressed surfaces have to be protected against wear, can today be deposited only in thicknesses that are insufficient for many applications or, alternately, have to be modified by the incorporation of other atoms, for example silicon, various metals and fluorine, which also modifies their properties. However, the reduction of the stresses within the layer and the consequently improved adhesion obtained in this manner was always associated with a clear loss of hardness and this, especially in wear protection applications, will often have negative effects as regards the useful life of the coated object.

An additional deposition of running-in layers containing such materials as graphitic carbon and/or a mixture of metals or metallic carbides and carbon could not therefore be taken into consideration, because the minimum layer thicknesses required to obtain the running-in effect not only built up further harmful internal stresses, but would also rendered problematical the adhesion to pure carbon layers. But it is only layer systems of this type that, given the combination of the very hard carbon or diamond layer and the slipping or running-in layer deposited thereon, can meet the ever greater demands that are nowadays being made on parts used, for example, in modern automobile engines.

In view of the high electrical resistance of hard DLC layers, the plasma-based processes for the production of DLC layers that are normally used today often seek to avoid the build-up of disturbing charges during the coating by using an HF bias or plasma (hereinafter HF=high-frequency is to be understood as refer to frequencies greater than 10 MHz), especially at the industrial frequency of 13.56 MHz. The known drawbacks of this technique are interference with electronically sensitive process control units that are difficult to avoid or dominate (HF feedbacks, sender effect, etc.), greater costs to avoid HF spark-overs, antenna effect of the substrates that have to be coated and a relatively large minimum distance between the materials to be coated materials associated therewith, which prevents optimal exploitation of the space and area available in the coating chamber. When HF processes are used, great care must therefore be taken to assure that such factors as an excessive charge density or wrong substrate/support clearances, etc., will not lead to the overlapping of dark spaces and the consequent production of secondary plasmas. Such secondary plasmas not only constitute energy sinks and therefore create extra loads for the plasma generators, but such local plasma concentrations often lead to thermal overheating of the substrates and undesired graphitization of the layer.

Since the substrate voltage in HF processes is exponentially dependent on the substrate surface in accordance with the equation $$U_S/U_E = C_E/C_S = (A_E/A_S)^4$$

where U stands for voltage, C for capacitance, A for surface area, while the subscripts S and E indicate, respectively, the substrate and the counter-electrode, the substrate voltage $U_S$ will diminish rapidly as the substrate area $A_S$ increase and this will be accompanied by a substantial upturn of the power loss. Consequently, depending on the capacity of the employed plasma generators, only a certain maximum area can be coated. Otherwise it will either prove impossible to introduce sufficient power into the system or the potential difference (substrate voltage) cannot be set sufficiently high to obtain the necessary ion plating effect to assure dense and well adhering layers.

Furthermore, when HF processes are used, it is usually necessary to introduce additional equipment into the installation in order to dynamically adapt the generator and plasma impedances to each other during the process by means of appropriate electrical networks, a so-called match-box for example.

The next few paragraphs will now be dedicated to giving a brief listing of various processes and/or layers systems known to prior art.

EP 87 836 discloses a DLC layer system with a 0.1–49.1% share of metallic components that is deposited by means of cathodic sputtering DE 43 43 354 A1 describes a process for the production of a Ti-containing multi-layer layer system with mechanically resisting layers consisting of titanium nitrides, titanium carbides and titanium borides and a friction-reducing surface layer containing carbon, where the titanium and nitrogen are continuously reduced in the direction of the surface.

The process for the production of DLC layers described in U.S. Pat. No. 5,078,848 avails itself of a pulsed plasma jet. Owing to the directional particle radiation from a source with only a small output opening, such processes are only conditionally suitable for a uniform coating of larger surfaces.

Various CVD processes and/or mixed SiDLC/DLC layers produced by means of such processes are described in the following documents:

EP-A-651 069 described a friction-reducing wear protection system of 2–5000 alternating DLC and SiDLC layers. A process for the deposition of a-DLC layers with an intermediate Si layer and an a-SiC:H transition zone adjacent thereto to improve the adhesion is described in EP-A-600 533. EP-A-885 983and EP-A-856 592 likewise describe various processes for the production of such layers. In EP-A-885 983, for example, the plasma is produced by means of filament heated by direct current, while a direct voltage or an MF between 20 and 10,00 kHz is applied to the substrates (MF=medium frequency is herein after to be understood as referring to the frequency range between 1 and 10,000 kHz).

U.S. Pat. No. 4,728,529 describes a method of depositing DLC by means of the use of an HF plasma, the layer being formed in a pressure range between 103 and 1 mbar from an oxygen-free hydrocarbon plasma to which, if necessary, inert gases or hydrogen may be added.

The process described in DE-C-195 13 614 utilizes a bipolar substrate voltage with a shorter positive pulse duration in a pressure range between 50 and 1000 Pa. It obtains the deposition of layers in the range between 10 nm and 10 μm and a hardness between 15 and 40 GPa.

A CVD process with a substrate voltage produced independently of the coating plasma is described in DE-A-198 26 259, the applied substrate voltages being preferably bipolar, but other periodically modified voltages may also be used. But this calls for a relatively costly electricity supply unit for carrying out the process, because it has to be provided in duplicate.

Furthermore, processes providing a combination of traditional hard-material layers with a carbon-rich covering layer with good slipping properties have been known for a longish time.

U.S. Pat. No. 5,707,748, for example, discloses a layer combination consisting of metal-containing hard-material layers (TiN, TiAlVN, WC) and a less hard metal carbide layer with an increasing content of graphitically bound carbon (i.e. carbon in $sp^2$ hybridization). Given the good slipping properties of metal/carbon and/or metal carbide/carbon (MeC/C) layers, these are preferably used in tribo-systems when, over and above protection of the coated part, these are to obtain also a reduction of the friction forces and/or protection of the body with which they come into contact (counterbody). Me/C/C layers with a high carbon component have proved particularly effective in this connection, because the soft covering layer produces a running-in effect, while the transfer of carbon particles makes it possible to obtain a lubricating effect for the entire tribo-system, Similar layer combinations with an adhesion-improving metallic intermediate layer between the hard-material layer and the Me/C or Me/C/C layer containing graphitic carbon are described in WO 99-55929.

The present invention therefore sets out to provide relatively thick DLC layer systems characterized by considerable hardness and excellent adhesion, where the systems are also to possess a sufficiently high conductance to permit their being deposited without HF bias, thereby making it possible to use a process and a device that are not associated with substantial costs and are yet highly effective for industrial use. Accordingly, it is another task of the present invention to make available an appropriate process and an appropriate device.

This task is solved by a layer having the characteristics of Feature 1 and a process in accordance with Feature 11 and a device in accordance with Feature 30. Advantageous embodiments are described in the dependent features.

Surprisingly it has also been found that it is possible to provide even relatively thick DLC layers with an additional layer with particularly favourable slipping an if desired, running-in properties without thereby worsening the adhesion. For the first time it has thus become possible to combine the great hardness of DLC layers with the favourable slipping properties of metal carbon layers. This can be done not only by depositing slipping layers on DLC layers in accordance with the inventions but also by the use of one of the described processes for the deposition of a slipping layer on known DLC layers and/or known DLC layer systems.

It is therefore the task of the present invention to provide also a DLC and/or a diamond layer with an excellent adhesion and a high wear resistance that, as compared with conventional DLC and/or diamond layers, will have improved slipping and—if desired—running-in properties. Such a DLC-slipping layer system can be of advantage for wear protection, corrosion protection and the improvement of the slipping properties, and this especially when properties that have hitherto been difficult to realize in a layer system are also desired.

It is a further task of the invention to make available a process and a device for the production of a DLC-slipping layer system in accordance with the invention.

In accordance with the invention this task is absolved as in the first paragraph of the description.

Layer System

A DLC layer system in accordance with the invention is obtained by the production of a layer with the following layer structure.

An adhesion layer with at least one element from the group of elements of subgroups IV, V and VI and silicon is situated directly on the substrate. Preference is accorded to an adhesion layer of the elements chromium or titanium, which have proved particularly suitable for this purpose.

This is followed by a transition layer that is preferably formed as a gradient layer, in which the metal content diminishes in the direction at right angles to the substrate surface, while the carbon content increases.

The transition layer comprises essentially carbon aid at least one element of the group of elements that constitute the adhesion layer. In a preferred embodiment it may also contain hydrogen. Over and above this, both the transition layer and the adhesion layer contain inevitable impurities constituted by, for example, atoms incorporated into the layer from the surrounding atmosphere, for example, atoms of such inert gases as argon or xenon used in the process.

When the transition layer is deposited in the form of a gradient layer, the increase of carbon in the direction of the covering layer can be obtained by an increase of the possibly different carbide phases or an increase of the free carbon or by a mixing of such phases with the metallic phase of the transition layer. As is well known to persons skilled in the art, the thickness of the gradient layer and/or the transition layer can be set by setting appropriate process ramps/slopes. The increase of the carbon content and/or the reduction of the metal phase may be either continuous or consist of individual steps, and in at least a part of the transition layer a series of individual layers rich in metal and rich in carbon may also be provided for a further reduction of layer stresses. By means of the mentioned ways of forming the gradient layer the material properties (modulus of elasticity, structure, etc.) of the adhesion layer and the adjacent DLC layer are matched to each other in a substantially continuous manner and this counteracts the danger of cracks forming along a boundary surface that would otherwise form between the metal or silicon and the DLC.

The end of the layer package is constituted by a layer that consists essentially exclusively of carbon and preferably hydrogen and, as compared with the adhesion layer and the transition layer, also has a greater thickness. In addition to carbon and hydrogen, this layer may once again contain inert gases like argon or xenon. But in this case it is altogether essential that there should be no additional metallic elements or silicon.

The hardness of the entire DLC layer system is set to a value greater than 15 GPa, preferably greater than/equal to 10 GPa, and the attained adhesion is better or equal to HF 3, preferably better or equal to HF 2, especially equal to HF 1 according to VDI 3824 Sheet 4. The hardness as measured by the Knoop method will amount to 0.1 N Last, i.e. correspond to HK 0.1: The surface resistance of the DLC layer will lie between $\delta=10^{-6}$ $\Omega$ and $\delta=5$ M$\Omega$, preferably between 1 $\Omega$ and 500 k$\Omega$, with an electrode gap of 20 mm. At the same time, the DLC layer under consideration will be distinguished by a typical friction coefficient that is low for DLC, preferably $\mu \leq 0.3$ in the pin/disk test.

The layer thicknesses total >1 µm, preferably >2 µm, where the adhesion layer and the transition layer will preferably have layer thicknesses of between 0.05 µm and 1.5 µm especially between 0.1 µm and 0.8 µm. while the covering layer will preferably have a thickness between 0.5 µm and 20 µm, especially between 1 µm and 10 µm.

The hydrogen content in the covering layer is preferably 5 to 30 atom %, especially 10–20 atom %.

REM photographs show that DLC layer systems deposited in accordance with the invention have fracture surfaces that, in contrast with conventional DLC systems, do not have a glass-like amorphous structure, but rather a fine-grained structure, where the grain size preferably amounts to $\leq 300$ mm, especially $\leq 100$ mm.

In tribological tests under substantial loads the coating proves to have a useful life several times greater than such other DLC layers as, for example metal/carbon layers, especially WC/C layers. On an injection nozzle for internal combustion engines provided with a DLC layer, for example, only slight wear was ascertained in the test after 1000 h, whereas a nozzle coated with a WC/C layer failed in the same test after 10 h on account of substantial surface wear that reached right down to the base material.

The layer roughness of the DLC layer in accordance with the invention preferably has a value of Ra=0.01–0.04, where Rz, measured in accordance with DIN, amounts to <0.8, preferably <0.5.

The advantages of a layer system in accordance with the invention having the aforesaid properties are constituted by the first successful combination of large layer thicknesses with excellent adhesion, supplemented by a conductance that is still sufficient to render possible a relatively simple process procedure in industrial production.

Notwithstanding the substantial hardness of >15 GPa, preferably $\geq 20$ GPa, the layer, due to its structure and the process steps in accordance with the invention, shows a clearly improved adhesion. Conventional layer systems here stand in need of doping in the function layer (DLC) in order to reduce the layer stresses, though the doping also reduces the hardness.

REM photographs of the fracture surface of the layer in accordance with the invention reveal, in contrast with previously known DLC layers, which have the typical fracture of a brittle amorphous layer with partly seashell-like depressions, a fine-grained and straight fracture surface. Layers with the above-described property profile are particularly suitable for applications in machine construction, for example for the coating of heavily loaded pump or die holder pistons and valve drives, cams and/or camshafts as used in internal combustion engines and gears for motor vehicles, but also for the protection of heavily loaded gearwheels, plungers, pump spindles and other components that are required to have a particularly hard and smooth surface with good slipping properties.

In the tool sector, these layers—given their great hardness and very smooth surface—can be advantageously used for tools for non-cutting operations (pressing, punching, deep drawing, . . . ) and for injection moulding dies, but also for cutting tools, albeit subject to certain restrictions when processing ferrous materials, especially when the application calls for a small coefficient of friction in combination with great hardness.

The growth rate of the DLC layer is of the order of 1–3 µm the layer stress for the entire system is about 1–4 GPa and thus within the customary range of hard DLC layers. In view of the remarks made above, the conductance will be set to between $\delta=10^{-6}$ $\Omega$ and $\delta=5$ M$\Omega$, preferably between $\delta=10^{-3}$ $\Omega$ and $\delta=500$ k$\Omega$ (what was measured in this case was the surface resistance with a measuring electrode gap of 20 mm).

Although the slipping properties obtained with DLC layer systems deposited in accordance with the invention are more favourable than those of other hard-material surfaces, for example hard nitride and/or carbide layers, they do not reach the exceptionally small friction coefficients that can be realized with metal/carbon layers and are not suitable for running-in layers.

If the slipping and/or running-in properties of the DLC layer or the DLC layer system are to be further improved, it is recommended to terminate the system by applying also a softer slipping layer containing a relatively large proportion of graphitic carbon. Such a layer can also be advantageously applied to DLC layers and layer systems not in accordance with the invention, especially to nanocristalline diamond layers.

We shall now describe a DLC-slipping layer system in accordance with the invention that may advantageously consist of a DLC layer system as described above and a slipping layer deposited thereon, though this is not to be regarded as being in any way limitative. It has surprisingly been found that with very differently structured slipping layers it is possible not only to improve the slipping and possibly also the running-in properties, but—notwithstanding the greater layer thickness—obtain also the excellent adhesion of the DLC layer system for the DLC-slipping layer system.

An advantageous embodiment of the friction reducing layer that is particularly suitable for use on the above-described DLC layer system in accordance with the invention consists of applying a DLC structure without an additional metallic element, but with an increasing proportion of $sp^2$ bonds, preferably in a graphitic layer structure, thereby reducing the hardness of the covering layer and improving its slipping properties, where necessary also its running-in properties.

Another advantageous embodiment of the slipping layer can be obtained by forming a second inverse gradient layer in which the metal content increases in the direction of the surface, while the carbon content diminishes. The metal content is increased until the coefficient of friction attains a desired low value. Preferably one or more metals of sub-groups IV, V and VI [of the periodic table] are used for this purpose, as well as silicon. Particularly preferred are chromium, tungsten, tantalum, niobium and/or silicon. The metal share of the layers should lie between 0.1 and 50 atom %, preferably between 1 and 20 atom %.

Another preferred embodiment of the friction-reducing layer can be produced by depositing a metallic or carbidic intermediate layer, especially of chromium or WC, on the layer that essentially consists exclusively of carbon and hydrogen, this being once again followed by a covering layer with a diminishing metal content and an increasing carbon content formed in a manner similar to the first gradient layer. In this connection it will be advantageous but not essential to use the same metallic element or elements as in the first gradient layer in order to keep the complexity of the coating device to a reasonable minimum. Here, too, the metal part of the layers should lie between 0.1 and 50 atom %, preferably between 1 and 20 atom %.

Surprisingly it has been found that slipping layers containing metals are particularly suitable for bringing about a clear performance improvement even when applied to DLC layers deposited by conventional means. A reason for the small influence that is thereby exerted on the overall adhesion of such systems could be due to the fact that he introduced additional layer stresses are small and can be readily set.

With all three possibilities it has been found advantageous to provide a terminal region with an unchanged (i.e. constant) layer composition, in order to maintain the layer properties (friction coefficient, surface tension, wettability, etc.), optimized for each particular application, notwithstanding a certain wear of the layer and render possible a running-in of the layer.

Depending on the metal that is used and the residual excess of graphitic carbon, the coefficient of friction may be set to between $\mu=0.01$ and $\mu=0.2$ (the figures relate to the pin/disk test in a normal atmosphere with about 50% humidity).

The hardness of the DLC layer is preferably set to a value greater than 15 GPa, preferably greater than/equal to 20 GPa, while the hardness of the softer terminal slipping layer may be set as required in each particular case.

The integral hydrogen content of the layer system in accordance with the invention is preferably set to between 5 and 30 atom %, preferably between 10 and 20 atom %.

The layer roughness can be set to an Ra value of less than 0.04, preferably less than 0.01, or an $Rz_{DIN}$ value of less than 0.8, preferably less than 0.5.

The advantages of such a DLC-slipping layer system in accordance with the invention consist of the combination of the great hardness of the DLC layer with slipping properties that, as compared with the already good slipping behaviour of the DLC layer, are improved by up to one order of magnitude. The coefficient of friction, for example, can thus be reduced to less than $\mu=0.1$. Furthermore, due to initial layer reduction and graphitic lubrication of the body with which it comes into contact, it thus becomes possible for the first time to confer running-in behaviour even upon DLC layers, so that that the wear of the other body can be clearly diminished even when it is devoid of a protective coating.

Moreover, use of one of the pure DLC layers described above makes it possible to set a smaller Rz or Ra number, i.e. a smaller roughness of the coated surfaces, than could be set with conventionally used hard-material layers, especially layers deposited by means of the are process. Due to specially hard roughness peaks, such known combinations of hard materials and slipping layers often disturb and even prevent the running-in behaviours of the tribosystem, so that the surface of the other body may be partly or wholly destroyed, especially when the other body is not itself protected by a hard layer. This is particularly important in tribosystems with a high slipping component, for example, tipping and slipping levers on cup plungers, different gears, etc.

Here the superiority of DLC-slipping layer systems as compared with both known combinations of hard materials and slipping layers and pure DLC layer systems came to the fore in various applications.

Given their great hardness and very smooth surface, these layers can also be used to good advantage in the tool sector, especially in tools for non-cutting operations (pressing, punching, d ep drawing, . . . ) and injection moulding dies, but also for cutting tools, though in this case subject to certain limitations when ferrous materials have to be processed, especially when a particularly small coefficient of friction is needed, possibly in combination with a defined running-in effect. When using drill bits coated in accordance with the invention, for example, a polishing effect was observed on the machined surfaces already after a single use (just one hole), and this is of advantage, for example, when deep holes have to be drilled. The use of tools coated in accordance with the invention can thus avoid costly after-polishing of the machined surfaces.

DLC-slipping layer systems in accordance with the invention can be deposited with a smoother surface than conventional combinations of hard materials and slipping layers (for example TiAlN//WC/C) deposited—for example—by means of arc vaporizers and can be integrated in a continuous process more simply than, for example, known Ti-DLC//MoSx layer combinations.

Process

The process for the production of the DLC layer system in accordance with the invention is further distinguished by the following characteristics.

The parts to be coated are cleaned in a known manner appropriate for PVD processes and mounted in a holder device. In contrast with HF processes, it is possible to use for this purpose holder devices with 1, 2 and even 3—the exact number depends on the particle geometry—essentially parallel rotation axes, and this makes it possible to obtain a greater loading density. The holder device with the parts to be coated is introduced into the process chamber and, following pumping down to a starting pressure of less than 10–4 mbar, preferably 10–5 mbar, the processing sequence is commenced.

The first part of the process, the cleaning of the substrate surface, is carried out—for example—as a heating process, thereby removing any volatile substances that still adhere to the surface of the parts. To this end use is preferably made of an inert gas plasma ignited by means of a high current/low voltage discharge between one or more negatively biased filaments arranged in an ionization chamber adjacent to the process and the positively biased holder devices with the parts. This produces an intensive electron bombardment and therefore heating of the parts. The use of an argon-hydrogen mixture proved to be particularly favourable in this connection, because the reducing effect of the hydrogen also exerts a cleaning effect on the surfaces of the parts. The high current/low voltage discharge can be controlled with either a static or, advantageously, an essentially locally variable mobile magnetic field. The place of the ionization chamber described above may also be taken by a hollow cathode or some other know ion or electron source.

Alternatively, of course, it is also possible to use other heating processes, for example, radiation beating or induction heating.

After attainment of a temperate level that has to be specified in accordance with the base material of the parts, it is also possible to start an etching process as an additional or alternative cleaning process by igniting a low-voltage arc between the ionization chamber and an auxiliary electrode, the ions being directed onto the parts by means of a negative biasing voltage of 50–300 V. The ions will thus bombard the surface of the parts and remove the residual impurities. A clean surface is thus obtained. In addition to such inert gases as argon, the process atmosphere may also contain hydrogen.

The etching process may also be carried out by applying a pulsed substrate biasing voltage with or without the support of a low-voltage arc as has just been described, use being preferably made of a medium-frequency bias in the range between 1 and 10,000 kHz, especially between 20 and 250 kHz.

With a view to assuring the adhesion of the DLC layer system to the substrate, a preferably metallic adhesion layer, especially a layer consisting of chromium or titanium, is deposited by means of a known PVD or Plasma-CVD process, such as arc vaporization or various ion plating processes, but preferably by means of cathodic sputtering of at least one target. The deposition is supported by applying a negative substrate biasing voltage. The ion bombardment and the layer compaction that is thereby effected during the sputter process may be additionally supported by means of a low-voltage arc are operated in parallel and/or a magnetic field applied to stabilize and/or intensify the plasma and/or the application of a DC biasing voltage to the substrate or the application between the substrate and the process chamber of a medium-frequency bias in the range from 1 to 10,000 kHz, especially from 20 to 250 kHz.

The thickness of the adhesion layer is set in a known manner by choosing the sputtering or deposition time and the power in keeping with the particular geometry pf the given plant.

When the plant geometry is as described below, for example, chromium is sputtered for a period of 6 minutes from two targets—advantageously arranged opposite each other—at a pressure between $10^{-4}$ to $10^{-3}$ mbar, a substrate bias of Ubias=–75 V and a power of about 8 kW in an argon atmosphere.

Following the application of the adhesion layer, the invention calls for the deposition of a transition layer to assure as gradual as possible a transition between the adhesion layer and the DLC-layer.

The transition layer is deposited in such a manner that the plasma-supported deposition of the components of the adhesion layer is accompanied by the deposition of carbon from the gaseous phase. This is preferably done by means of a Plasma-CVD process in which a gas containing carbon, preferably hydrocarbon gas, especially acetylene, is used as reaction gas.

A special "pulsed" biasing voltage of medium frequency is applied to the substrate during the application of the transition layer, superposing also a magnetic field.

In order to obtain the preferred formation of a gradient layer, the proportion of carbon deposited is increased as the deposition of the transition layer proceeds, which may be done either continuously or in steps, until eventually only essentially pure carbon is deposited.

At this stage of the process the diamond-like carbon layer is then produced by means of plasma-CVD deposition of carbon from the gaseous phase, where a gas containing carbon, preferably hydrocarbon gas, especially acetylene, is used as reaction gas. While this is done, the substrate biasing voltage is maintained and the superposed magnetic field likewise continues to act.

In a preferred embodiment the reaction gas used to deposit the carbon for forming the transition layer and the covering layer with diamond-like carbon may consist not only of the gas containing carbon, but also of hydrogen and inert gases, preferably argon and xenon. The pressure set in the process chamber amounts to between $10^{-4}$ and $10^{-2}$ a mbar.

During the deposition of the covering layer from diamond-like carbon the proportion of the gas containing carbon will preferably be increased, while the proportion of inert gases, especially argon, will be reduced.

The biasing voltage applied to the substrate during the process steps for the deposition of the adhesion layer, the transition layer and the covering layer, especially during the formation of the transition layer and the covering layer, may be a direct voltage (DC) with superposed AC or pulse or a modulated direct voltage, especially a unipolar (negative) or bipolar substrate biasing voltage, pulsed in a medium-frequency range between 1 and 10,000 kHz, preferably between 20 and 250 kHz. The pulse form used for this purpose may be either symmetrical—the form being, for example, sinusoidal, rectangular or in the manner of saw teeth—or asymmetric in such a way as to apply long negative and short positive pulse periods or large negative and small positive amplitudes.

Over and above this, a longitudinal magnetic field with a uniform field line pattern will preferably be applied during the entire coating process, where the magnetic field should be capable of being varied laterally and/or spatially, either continuously or in steps.

When a DC bias is used for the deposition of the adhesion layer, a medium-frequency generator is preferably connected to the holder device, the generator being such as to deliver its voltage pulses (control by means of variation of the power supply is also possible, but is not preferred) in the form of a sinusoidal or some other bipolar or even unipolar signal pattern. The employed frequency range will be from 1 to 10,000 kHz, preferably from 20 to 250 kHz, while the amplitude voltage may lie between 100 and 3000 V, preferably between 500 and 2500 V. Preferably the change of the substrate voltage will be obtained by the switching of a generator specially designed for the delivery of direct and medium-frequency voltages. In another advantageous embodiment a medium-frequency voltage is applied to the substrates also for the carrying out of the etching process and the deposition of the adhesion layer. When a bipolar substrate voltage is used, it has been found to be particularly advantageous to apply asymmetric pulse forms: for example, the positive pulse may be applied either for a shorter period or with a smaller voltage than the negative pulse, because the electrons follow the field more quickly and upon impact, given their small mass, will produce above all additional heating of the parts and this can lead to damage due to overheating, especially in the case of temperature-sensitive base materials. Even when other signal patterns are employed, this danger can be counteracted by providing a so-called "OFF-time", i.e. interposing a zero signal between the application of individual or several signal periods with a power component ("ON-time").

Either simultaneously with the application of the medium-frequency or with a cell delay thereafter when a DC bias is used for the application of the adhesion layer, or after deposition of the layer thickness desired for the adhesion layer when a medium-frequency is used, a hydrocarbon gas, preferably acetylene, is allowed to enter the recipient at a flow rate that is increased either in steps or, preferably, continuously. Likewise either at the same time or with a possibly different delay time, the power of the at least one metallic or silicon target is reduced either in steps or continuously. In this connection it is preferred to reduce the power of the target to a minimum power at which stable operation without poisoning phenomena is still possible and which a person skilled in the art can readily determine in accordance with the attained hydrocarbon flow rate. Subsequently, the at least one target is screened off from the process chamber, preferably by means of one or more shields arranged in a movable manner, and switched off. This measure substantially prevents the target becoming covered with a DLC layer, so that it becomes possible to do without the otherwise necessary free sputtering between individual DLC coating charges. When the next charge is carried out, it will be sufficient to re-establish the power of the at least one target while keeping the shield closed in order to render the target surface completely blank and therefore suitable for the deposition of the adhesion layer.

An important contribution to the stabilization of the DLC coating process in accordance with the invention is made by the formation of a longitudinal magnetic field. If not already used in the previous process step for the application of the adhesion layer, this field will be established at substantially the time when the substrate voltage is switched to the medium-frequency generator. The magnetic field will be so designed as to obtain as uniform as possible a field line pattern within the process chamber. To this end current is preferably passed through two electromagnetic coils that essentially delimit the process chamber on two opposite sides insuch a manner as to produce identically orientated magnetic fields in both coils that will therefore intensify each other. When smallish process chambers are used, an adequate effect may also be obtained with just a single coil. In this way one obtains an approximately uniform distribution of the medium-frequency plasma even over rather substantial chamber volumes. Nevertheless, due to the different geometries of the parts to be coated and/or the holder devices, secondary plasmas may still form in individual cases, when certain geometric and electromagnetic boundary conditions are satisfied. This can be counteracted by means of the formation of a second and spatially variable magnetic field, for which purpose the coil currents are varied either in unison or, preferably, in opposition. For example, the current flowing through the first coil may at first be kept greater than the current in the second coil for a period of 120 seconds. During the subsequent 90 seconds the current values will be inverted, so that the second magnetic field will be stronger than the first. These magnetic field settings can be varied periodically, either continuously or in steps as previously described, so that the formation of stable secondary plasmas can be avoided by an appropriate choice of the respective coil currents.

It is only due to the use of the magnetic field and the consequently attained significant increase of the plasma intensity that it becomes possible to obtain a stable CVD process for the deposition of pure DLC layers with high deposition rates in the range between 0.5 and 5 µm/h, preferably between 1 and 4 µm/h, even in lower pressure ranges, for example, at pressures between $10^{-3}$ and $10^{-2}$ mbar, this in contrast with the present state of the art. Not only the substrate current, but also the plasma intensity is directly proportional to the activation of the magnetic field. Both parameters also depend on the magnitude of the available surfaces to which a biasing voltage is applied. The use of lower process pressures makes it possible to deposit smoother surfaces with a smaller number of growth errors and also with less pollution due to the interference of alien elements.

Apart from the process parameters, the growth rate also depends on the loaded materials and the holder device. In this connection it is particularly important whether the parts to be coated are fixed to magnetic holder devices with one, two or three rotation axes or are clamped or plugged. The total mass and the plasma permeability of the holding devices are of importance, and faster growth rates and an on the whole better layer quality can be obtained with, for example, more lightly built holder devices, for example, by the use of spoke disks rather than full disks.

In addition to the longitudinal magnetic field that permeates the entire process chamber (far field), other local magnetic fields—the so-called near fields—may be provided to obtain a further increase of the plasma-intensifying magnetic field. Particularly advantageous in this connection is an arrangement in which—in addition to at least one magnetron magnet system of the at least one target—further preferably permanent magnet systems are attached to the walls delimiting the plasma chamber that have either a similar or the same magnetic effect as the at least one magnetron magnet system. In this connection either all the magnetron magnetic systems or the further magnetron magnetic systems may be given the same structure or, preferably, a reversal of the polarity. In this way it is possible to for the individual near field of the magnet systems and/or the magnetron magnet system as if they were a magnetic envelope surrounding the process chamber, thereby preventing the absorption of the free electrons by the walls of the process chamber.

Only a combination of the essential characteristics (features) of the process in accordance with the invention makes it possible to produce a layer as described hereinabove. Only use of plasmas stabilized by magnetic fields and use of an appropriately coordinated substrate biasing voltage makes it possible to use the holder devices optimized for conventional PVD processes with high packing density and process certainty. The process shows how the sequence and/or the combination of direct current and medium-frequency plasma can be used in an optimal manner for the deposition of a DLC layer.

Different process are used for building up the different slipping layers.

When a graphitized DLC layer is to be deposited, the application of the pure DLC layer is followed by setting the biasing voltage—given parameter settings that are otherwise either identical or similar—to a value greater than 2000 V, preferably between 2000 and 2500 V, either continuously or in steps. As the voltage increases, the proportion of the carbon atoms with a graphitic $sp^2$ bond will also increase. In this way improved slipping properties can be conferred upon the previously described pure DLC layer in a particularly simple manner.

There are various way in which an inverse gradient layer may be deposited. In the simplest case the process can be commenced by retaining the parameters that were used for the previous DLC layer but with the addition of one or more metals or metal sides. But it has been found to be advantageous to begin by either reducing the hydrocarbon component of the gas flow or to increase the inert gas component or to take both these precautions, thus avoiding target pollution and the consequent unstable process conditions. Furthermore, starting up the target behind shields that are at first kept closed may prove advantageous in order to avoid possible droplets reaching the substrate. Thereafter the power of the at least one target is increased—either in steps or, preferably, continuously—to a value at which the layer will posses the desired properties (coefficient of friction, etc.). The remaining parameters are preferably left unchanged, but an additional adjustment, if desired, is possible at any time. The process is then continued, preferably with constant parameter settings, until the desired overall thickness of the inverse gradient layer is obtained.

A further advantageous possibility for the formation of an inverse gradient layer is obtained if—either in addition to the previously mentioned hydrocarbon gas or in place thereof—gases that contain silicon or silicon and oxygen or nitrogen, for example: mono- or disilane, siloxane, hexamethyldisiloxane, hexamethyldisilazane, dimethyl-diethoxysilane, tetramethylsilane, etc., are introduced in order to influence the properties of the layer, especially its hardness and coefficient of friction. In this way it is possible—even without the additional use of one or more sputter targets—to obtain a gradient layer with a silicon, oxygen and/or nitrogen content that increases, for example, in the direction of the surface.

A slipping layer as gradient covering layer may be applied either directly on a DLC layer or after the deposition of a metallic or carbidic transition (intermediate) layer.

For example, the at least one source used for the production of the friction-reducing covering layer can be used in a manner similar to what has already been described above, but after a more marked reduction of the carbon content of the process gas, if necessary to 0%. Carbidic or metallic targets can be used for the production of the friction-reducing covering layer, the carbidic targets offering the advantage that they render possible a larger overall carbon content and thus render the layers more resistant. The content of graphitic carbon is once again set by the introduction of a carbon-containing reaction gas, where the gas flow will be advantageously increased—either as from the moment of switching on the target used for the production of the MeC/C layer or with an appropriate delay—by mean of a ramp function and maintained constant for a certain period of time at the end of the coating.

A particularly advantageous embodiment of the layer is obtained when a thin (0.01–0.9 μm) carbidic layer, a WC layer for example, is fast deposited on the DLC layer. It has surprisingly been found that carbidic layers are particularly suitable for assuring good adhesion on an already deposited DLC layer. The layer structure is terminated on the outside by a WC/C layer with an increasing carbon content and a thickness of about 0.1–05 μm. Advantageously, the thickness of the MeC/C layer is so chosen as to be smaller than that of the pure DLC layer.

A further preferred embodiment of a DLC-slipping layer system in accordance with the invention is obtained when the terminal slipping layer is applied to a diamond layer that has been deposited—for example—by means of a high current/low voltage discharge or hot filament technique.

Plant

The task set out above is further absolved by making available a device for the carrying of the costing process in accordance with one of features 10 to 26, said device comprising a vacuum chamber with a pumping system for the production of a vacuum in the vacuum chamber, substrate holders for receiving the substrates that are to be coated, at least one gas supply unit for feeding and dosing the process gas, at least one vaporizer device to provide coating material for deposition, an arc production device ti ignite a low voltage d.c. arc, a device for the production of a substrate biasing voltage and at least one or more magnetic field production devices for the formation of a magnetic field.

The magnetic field production devices are preferably constituted by at least one Helmholtz coil and, preferably, by a pair of Helmholtz coils.

When Helmholtz coils are used, the magnetic field and/or the density of the magnetic flux can be controlled both positionally and in time by means of the current flowing in the coils.

A further possibility for the production of a longitudinal magnetic field is obtained when two magnetrons are arranged on opposite sides of the recipient and each of these is associated with at least one electromagnetic coil. The at least one coil associated with each magnetron is advantageously attached in such a manner as to substantially delimit the entire side face of the magnetron magnet arrangement. The polarities of the opposite magnetron magnet systems are orientated so as to be diametrically opposed, i.e. the North pole of one system faces the South pole of the other system and vice versa. At the same the coils associated with the magnetrons are connected to a current source in such a manner that the fields of the magnetic coils complement each into a closed magnetic field in accordance with a Helmholtz arrangement and the polarity of the outer poles of the magnetron magnet systems and the magnetic coils act in the same direction. Such devices can be advantageously used both to intensify the magnetron plasma and to increase ionization during the plasma-CVD process.

The device further comprises a device for the production of a substrate biasing voltage that can modify the applied substrate biasing voltage either continuously or in steps and can also be operated in an appropriately unipolar or bipolar manner. The device is particularly suitable for the production of a pulsed substrate biasing voltage in the medium-frequency range.

The vaporizer devices used with the device comprise sputter targets, especially magnetron sputter targets, arc sources, thermal vaporizers and the like. In this connection it is advantageous for the vaporizer device to be capable of being separated from the remainder of the process chamber, for example, by means of swivelling shields.

The device is advantageously provided with substrate heating, which may take the form of inductive heating, radiation heating or the like, in order permit the substrates being cleaned by means of a heating step. But plasma ignition is preferred for this purpose.

To this end, among others, the device is provided with a low-voltage arc production device that comprises an ion source with a filament, preferably a refractory filament, especially made of tungsten, tantalum or similar, inside an ionization chamber, as well as an anode and a direct voltage supply. Preferably, the positive pole of the direct voltage supply will be capable of being selectively connected to the anode or the substrate holder devices, so that a low-voltage arc can be ignited between ion source and anode or between ion source and substrates. Similarly to the vaporizer device, the ion source can also be separated from the actual process chamber by means of, for example, a diaphragm made of, for example, tungsten tantalum or a similar refractory metal.

With a view to rendering possible a uniform coating process for all sides of the substrate, the substrate holder devices are mounted in a mobile manner and are preferable capable of rotating about at least one or more axis.

Due to the advantageous combination of the medium-frequency substrate voltage supply and a Helmholtz coil arrangement, which can also be realized by means of laterally mounted coils enveloping two opposite targets, it has become possible for the first time to utilize a stable medium-frequency plasma for carrying out a DLC process on an industrial scale even at low pressures. As compared with DLC layers produced by means of other systems, the layers produced in this way have greatly improved properties.

Using the coating plant here described and the previously described process, it is now possible for the first time to produce thick layers of pure DLC with excellent adhesion. By changing the process parameters, moreover, it is also possible to carry out a large part of the known plasma processes for the production of metal-carbon layers or mixed layers with other elements, silicon or fluorine for example, and for the production of multi-layer layer systems or simple known layer system deposited by means of PVD and/or CVD processes.

It is also possible to deposit DLC-slipping layer systems with settable slipping and running-in behaviour.

Further advantages characteristics and features of DLC-slipping layer systems are contained in the "Set of Features" appended to the present description.

Further advantages, characteristics and features of the invention are brought out by the detailed description about to be given of some preferred embodiments and the drawings attached hereto. The figures, albeit always in a purely schematic manner, show:

FIG. 1 a cross section through a device in accordance with the invention

Figure 2:
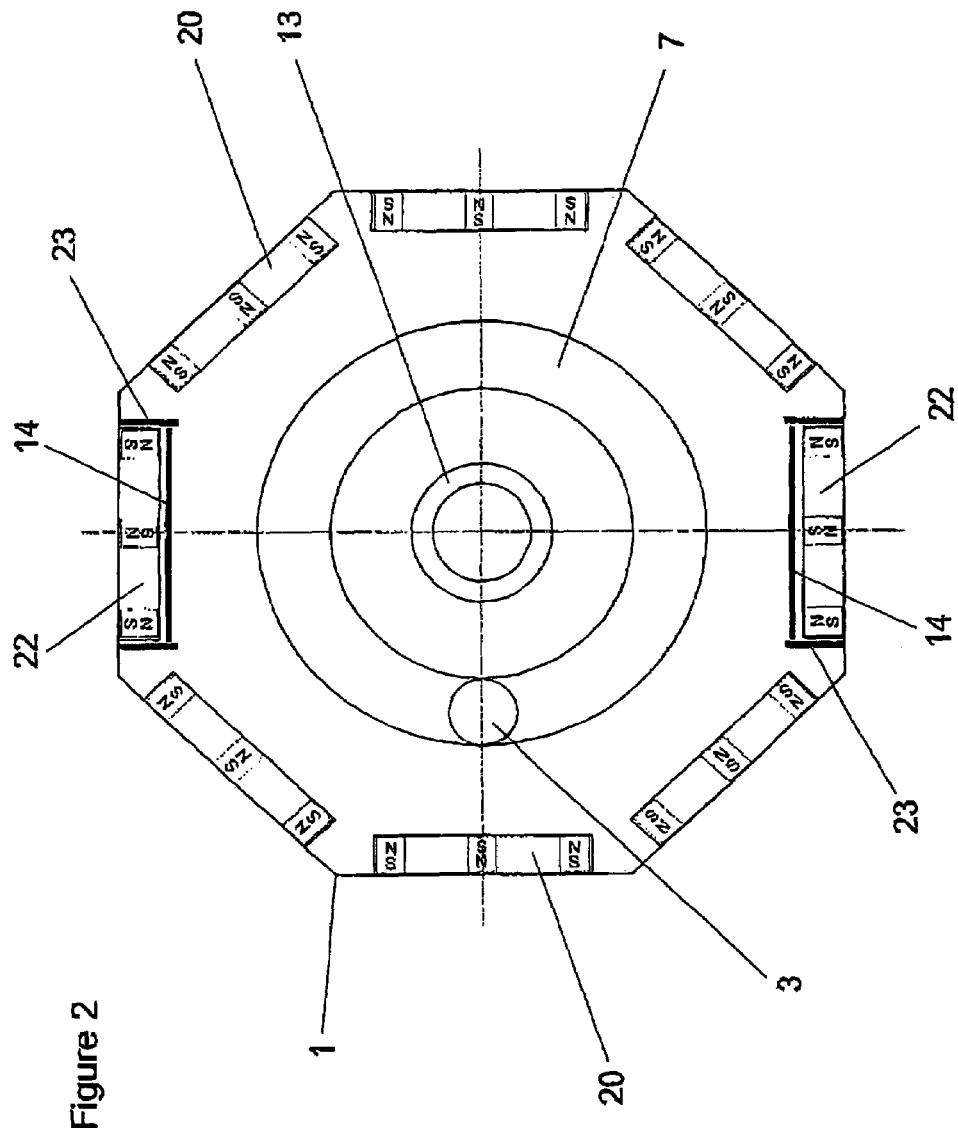

FIG. 2 the device in accordance with the invention of FIG. 1 seen from above

Figure 3:
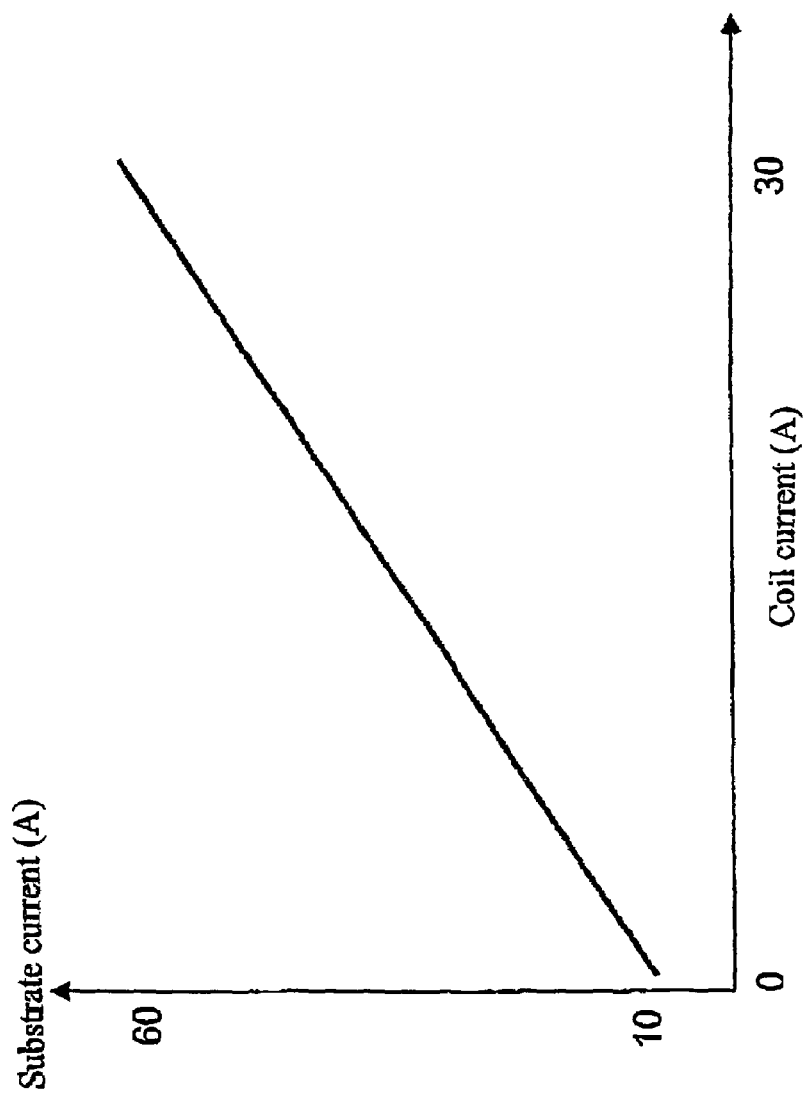

FIG. 3 influence of the coil current on the substrate current

Figure 4:
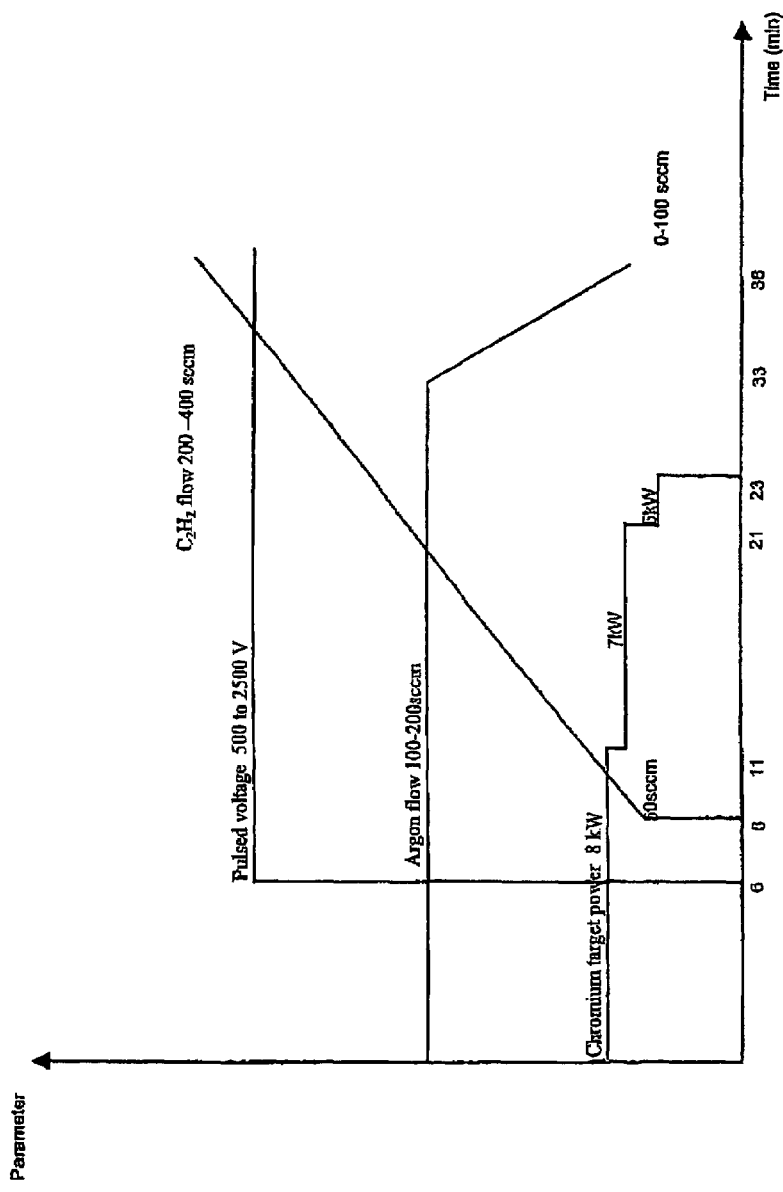

FIG. 4 the process parameters during slipping layer deposition

Figure 5:
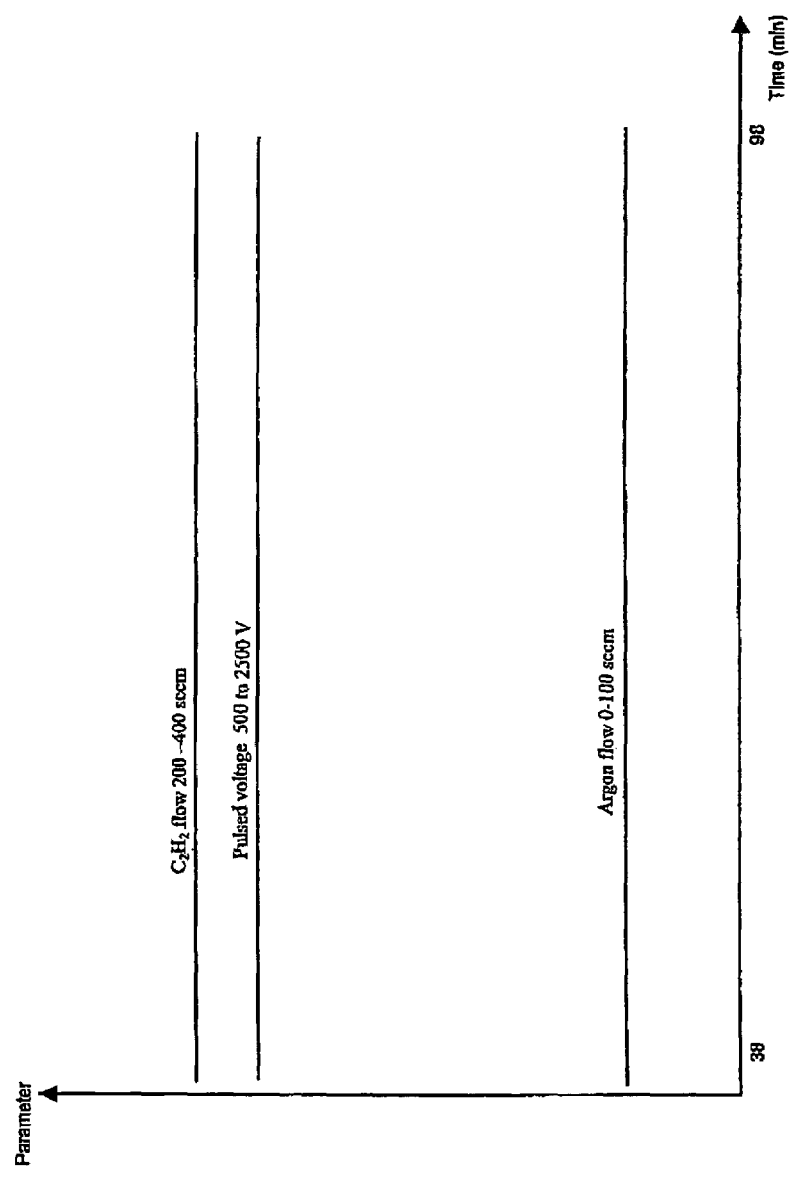

FIG. 5 the process parameters during DLC layer deposition

Figure 6:
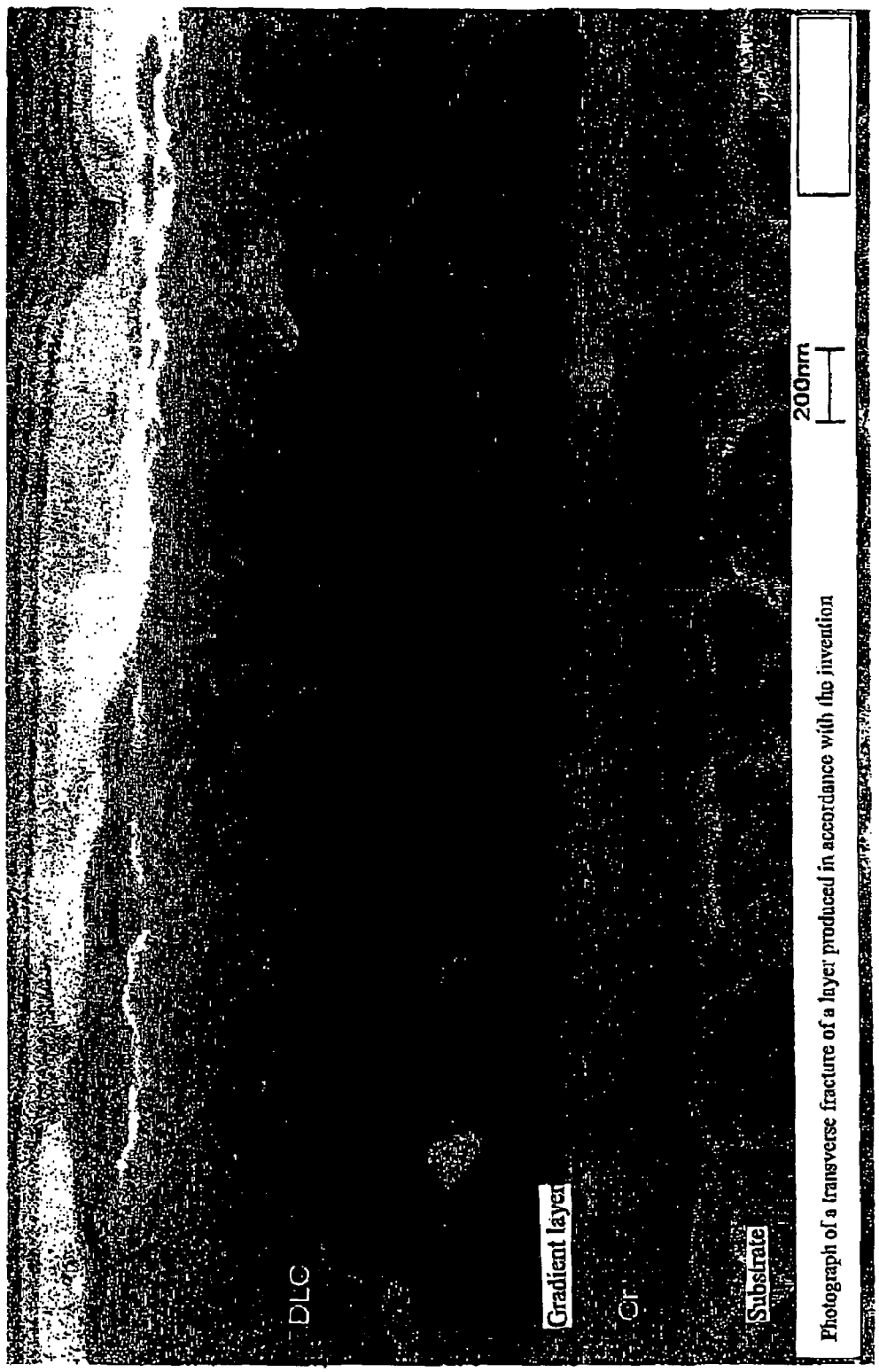
Figure 7:
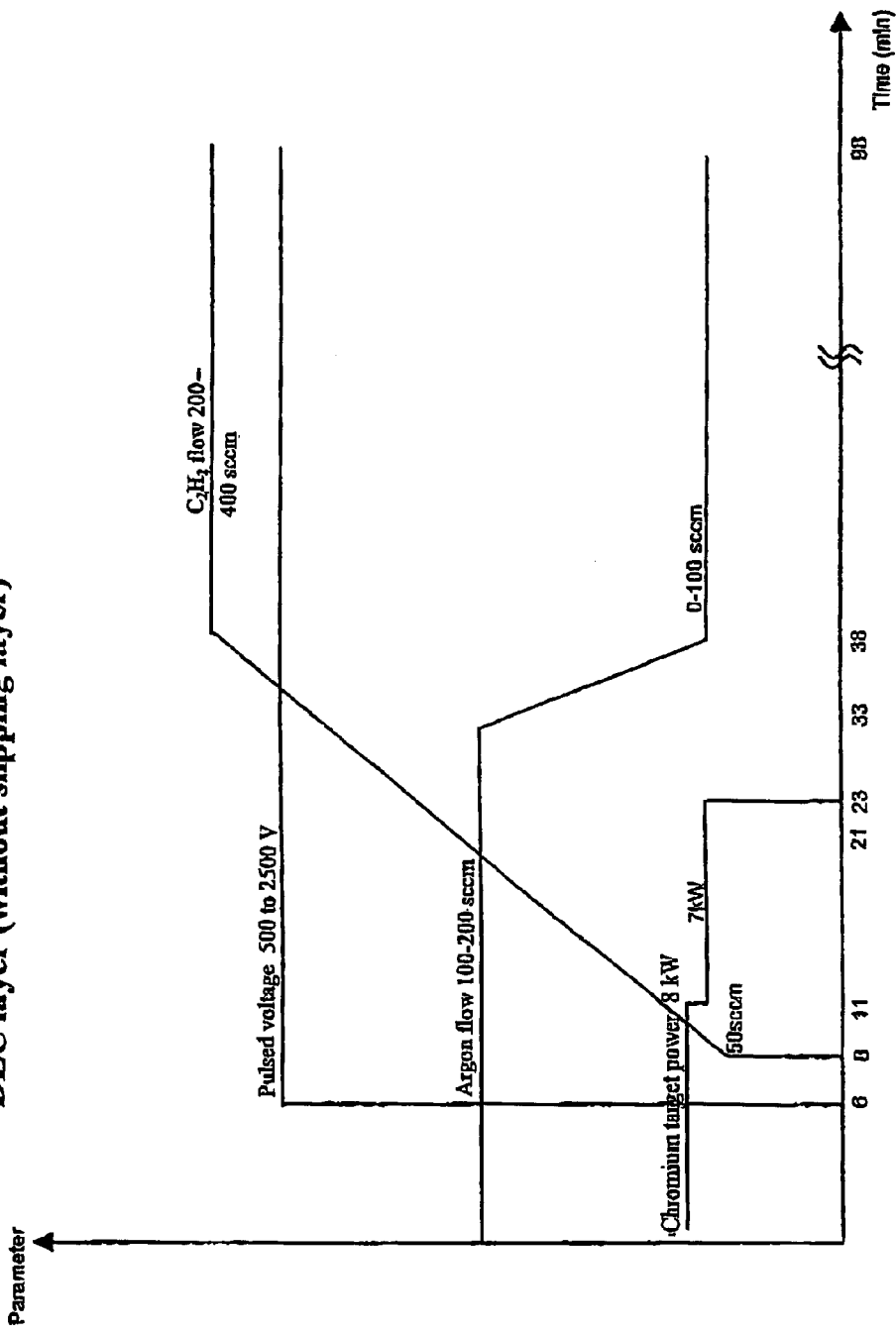
Figure 8:
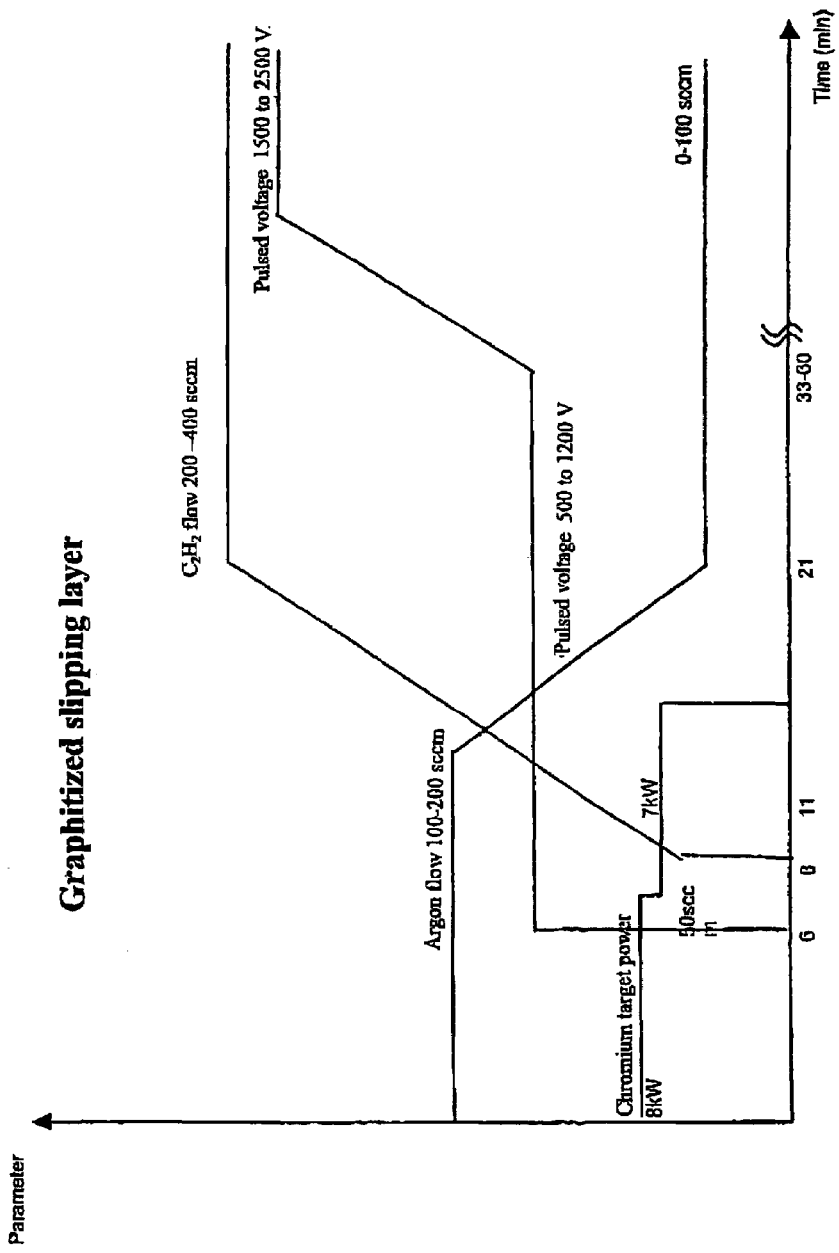
Figure 9:
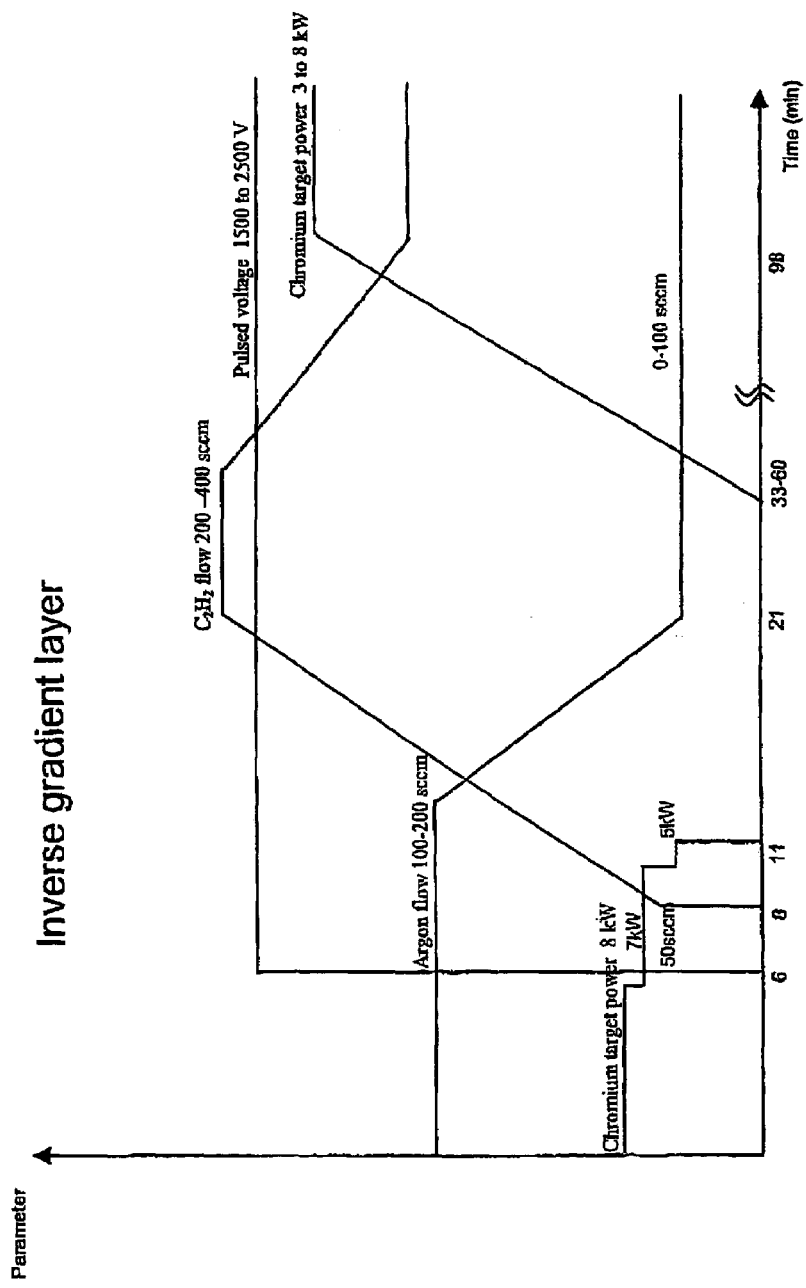
Figure 10:
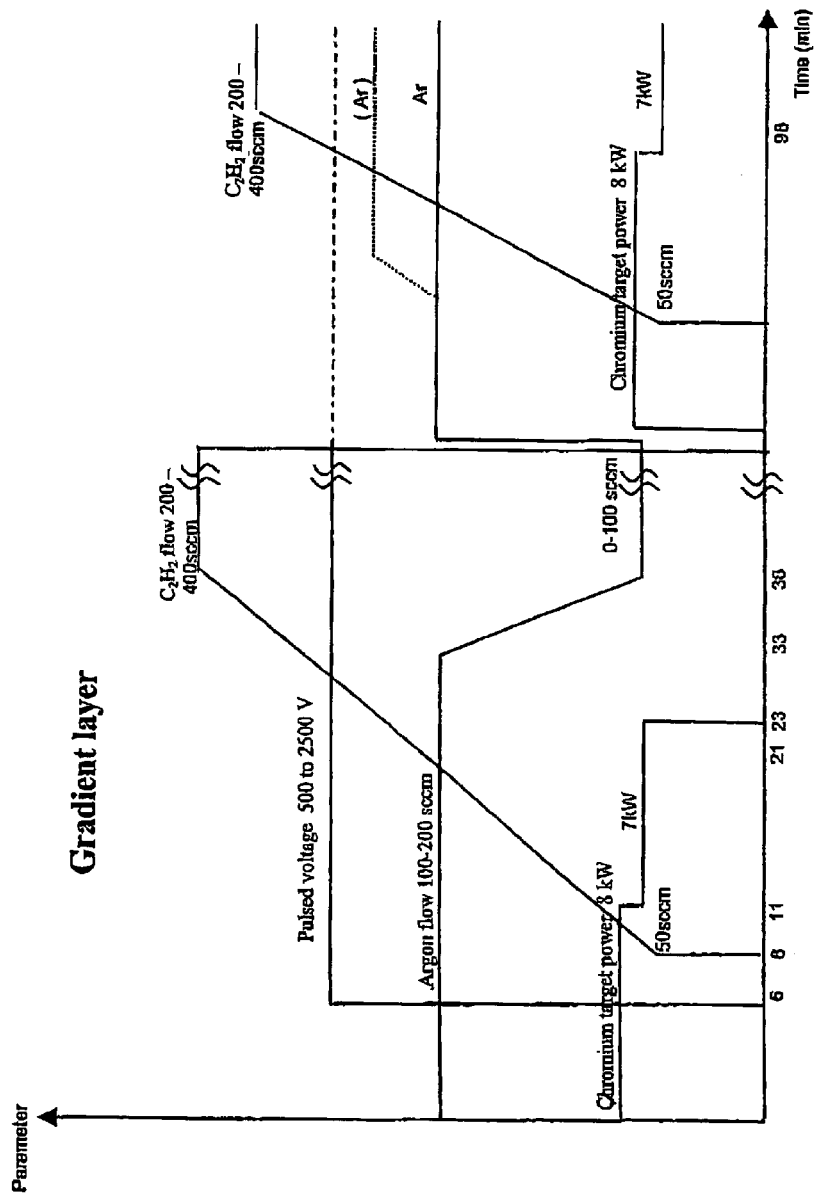
Figure 11:
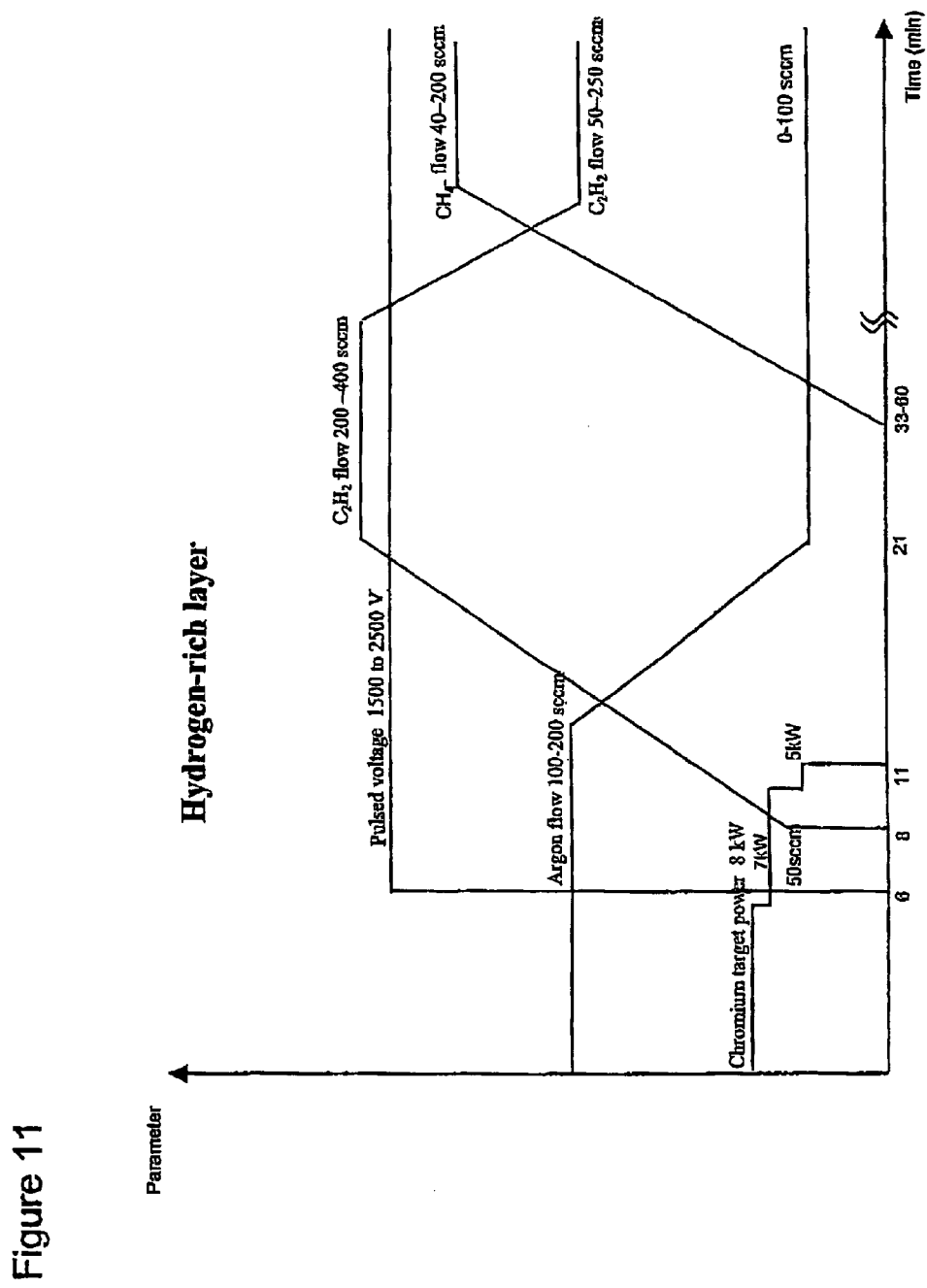

FIG. 6 an REM photograph of the fracture surface of a DLC layer in accordance with the invention FIG. 7 the process parameters during deposition of a DLC layer system FIG. 8 the process parameters during deposition of a graphitized DLC layer FIG. 9 the process parameters during deposition of an inverse gradient layer FIG. 10 the process parameters during deposition of a gradient layer FIG. 11 the process parameters during deposition of a hydrogen-rich layer FIG. 1 shows a schematic cross section through the process chamber 1 of a coating plant in accordance with the invention. The pats to be coated 2 are mounted one or more holding devices 3 that comprise means for the production of at least a simple rotation 4 and, if necessary, also second rotation 5. In a particularly advantageous embodiment the holding devices 3 are positioned on a stage 7 that can itself rotate about the plant axis 6.

The various process gases, especially argon and acetylene, can be fed into the process chamber through the gas inlets 8 and appropriate regulation devices that are not show in the drawing.

A pumping set 9 capable of producing a high vacuum is attached to the chamber by means of a flanged connection.

An ion source 10 is preferably arranged in the region of the plant axis and is connected to the negative output of a direct voltage supply 11. Depending on the particular process step, the positive pole of direct voltage supply 11 can be connected by means of a switch 12 on the stage 7 either to the holder device 3 and therefore also to the parts 2 in electric contact therewith (heating process) or to the auxiliary anode 13 (etching process or, if necessary, also during the coating processes).

Attached to the walls of process chamber 1 is at least one vaporizer source 14, preferably a magnetron or an arc vaporizer for the application of the adhesion and the gradient layer. In another embodiment of the vaporizer source 14, which is not here illustrated, this source can be arranged as an anodically switched crucible in the floor of process chamber 1. The material for the production of the transition or gradient layer is brought into the gaseous phase by means of heating by the low-voltage arc 15.

The chamber is further provided with an additional electric voltage supply 16, which can be used to apply to the substrates a periodically variable medium-frequency voltage in the range between 1 and 10,000 kHz, preferably between 20 and 250 kHz.

The electromagnetic coils for the production of a longitudinal magnetic field permeating the entire plasma space are arranged on opposite walls of process chamber 1 and are fed by at least one or, preferably, two separate direct voltage sources (not here shown) in such a way as to act in the same direction.

All the coating tests were carried with a processing chamber similar to the one shown in FIG. 1 that had the following dimensions:

Chamber height 920 mm, diameter 846 mm, volume 560 liters.

As additional measures to intensify the magnetic field and/or to render the field and therefore also the medium-frequency plasma 18 more uniform, magnet systems 20 for the formation of several near fields 21 may also be attached to the side walls 19 of the plasma chamber 1. In this connection it will be advantageous, possibly by using the at least one magnetron magnet system 22, as shown—for example—in FIG. 2, to arrange the magnet systems alternately with NSN and SNS polarity, thereby enclosing the plasma in the process chamber in a tunnel- or loop-shaped magnetic envelope.

The magnet systems 20 for the production of the near fields are preferably formed as magnetron magnet systems.

The individual systems of the coating plant are advantageously are preferably interrelated by means of a process control. In this way it will be possible to flexibly adapt to each other and to optimize for different processes not only the basic functions of a vacuum coating plant (pumping set control, safety control circuits, etc), but also the various plasma production systems, such as the magnetrons with the magnetron supply (not here described in detail), ionization chamber 1 and auxiliary anode 13 and/or stage 7 and direct voltage supply 11, as also stage 7 and medium-frequency generator 16, and the appropriate settings of the gas flows, as well as the possibly different coil currents.

FIG. 3 illustrates the relationship between substrate current and coil current when Helmholtz coils are used to build up a magnetic field. It can be seen that the substrate current—and therefore also the plasma intensity—is directly proportional to the coil current and the build-up of the magnetic field. This brings out the positive effect of a superposed magnetic field.

By way of example, FIG. 4 illustrates the variation of individual parameters during the application of a gradient layer: whereas all the other parameters remain as they were for the adhesion layer, the substrate bias is switched from a direct voltage to a middle frequency with an amplitude voltage between 500 and 2500 V and a frequency between 20 and 250 kHz. After about 2 minutes an acetylene ramp is started at 50 sccm and then stepped up to 350 sccm over a period of about 30 minutes. About 5 minutes after the switching on of the medium-frequency generator, the power of the employed chromium target is brought up to 7 kW and then brought back to 5 kW, after another 10 minutes, where it is kept constant for a further 2 minutes. The shields are then moved out to in front of the targets, which are switched off, thus commencing the deposition of the "pure" DLC layer, which is essentially made up of carbon, small quantities of hydrogen and even smaller quantities of argon atoms.

In the simplest case this process can be completed with the vaporizer source switched off, but with all the other parameters as they were for the previous gradient layer. But it has been found to be advantageous if during the course of the deposition of a pure DLC layer one either increases the carbon content of the gas flow or reduces the inert gas content or, preferably, adopts both these measures. Here, once again, the formation of a longitudinal magnetic field as described above becomes particularly important for the maintenance of a stable plasma.

FIGS. 4 and 5, by way of example, illustrate the variation of individual parameters during the application of the pure DLC layer. Following the switching off of the employed chromium target, while both the medium-frequency supply and the argon flow are kept at their previous values, the acetylene ramp commenced during the deposition of the gradient layer is stepped up uniformly to between about 200 and 400 sccm over a period of about 10 minutes. Subsequently the argon flow is continuously diminished over a period of about 5 minutes to a flow rate of the order of 0 to 100 sccm. The process is then completed during the next 55 minutes with constant parameter settings.

FIG. 6 shows a raster electron microscope photograph of the fracture surface of a DLC layer system in accordance with the invention. It can clearly be seen that the region of the covering layer of diamond-like carbon has a fine-grained structure, so that the DLC layer has a polycrystalline character.

FIG. 7, again by way of example, illustrates the overall variation of the individual parameters during the application of a DLC layer system in accordance with the invention.

FIG. 8 shows another example, this time the overall variation of the individual process parameters during the application of a DLC-slipping layer system in accordance with the invention. To this end the application of the DLC layer is followed—depending on the desired layer thickness, possibly after the deposition has continued for between 33 and 60 minutes—by setting the pulsed substrate bias by means of a voltage ramp to a value between 1500 and 2500 V and then depositing a running-in layer under constant conditions, all other process parameters remaining as before.

FIG. 9 shows by way of example the overall variation of the individual parameters during the application of a DLC-slipping layer system in accordance with the invention with an inverted gradient layer. To this end the application of the DLC layer is followed—depending on the desired layer thickness, possibly after the deposition has continued for between 33 and 60 minutes—the power of the at least one target is first kept at 5 kW for 10 minutes while the target is freely sputtered behind closed screens, after which the screens are opened and the power is raised to 7 kW over a period of about 30 minutes. At the same time the acetylene ramp may be started at, say, 350 sccm and reduced to 50 sccm over about 30 minutes. Subsequently the process is completed, preferably keeping the parameters constant until the desired thickness of the running-in layer is attained.

FIG. 10 gives an example of the variation of the individual process parameters during the deposition of a gradient layer as slipping layer. This can be done in a manner similar to the transition layer, but also without a metallic adhesion layer. Here, too, a running-in layer can be advantageously provided as terminal layer, keeping the parameters constant.

FIG. 11 shows an example of the overall variation of individual process parameters during the application of a DLC-slipping layer system in accordance with the invention with a slipping layer rich in hydrogen. Here the deposition of the DLC layer is followed by a methane ramp during which the supply is stepped up, for example from 0 to 100 sccm in about 30 minutes. An acetylene ramp is started at the same time, at 250 sccm for example, and then reduced to 120 sccm in the course of about 30 minutes. The running-in layer is deposited with constant parameters as terminal layer.

EXAMPLES OF THE CARRYING OUT OF THE INVENTION

Process Example 1

Heating Process

The process chamber is evacuated to a pressure of about $10^{-5}$ mbar, after which the process sequence is commenced. A heating process is carried as the first part of the process in order to raise the temperature of the substrate that is to be coated and free it from volatile substances adhering to its surface. To this end and argon-hydrogen plasma is ignited by means of a low-voltage arc between the ionisation chamber and the an auxiliary anode. The following Table 1 sets out the process parameters of the heating process:

| | |
|---|---|
| Argon flow | 75 sccm |
| Substrate biasing voltage [V] | 0 |
| Current of the low-voltage arc | 100 A |
| Hydrogen flow | 170 sccm |
| Current of upper coil | Fluctuating between 20 and 10 A |
| Current of lower coil | Fluctuating between 20 and 5 A in opposite direction |
| Duration of period between maximum and minimum coil current | 1.5 minutes |
| Heating time | 20 minutes |

The Helmholtz coils are used to activate the plasma and are cyclically controlled. The current in the upper coil varies between 20 and 10 A with a period of 1.5 minutes, while the current in the lower coil varies between 5 and 20 A with the same period but in the opposite direction.

The substrates warm up and the disturbing volatile substances adhering to their surfaces are driven into the gas atmosphere, whence they are sucked away by the vacuum pumps.

Etching Process

Once an even temperature has been attained, an etching process is commenced by using a negative biasing voltage of 150 V to draw ions from the low-voltage arc onto the substrates. To this end the orientation of the low-voltage arc and the intensity of the plasma are supported by the pair of Helmholtz coils, both of which are fixed with a horizontal alignment. The parameters of the etching process are set out in the table reproduced below.

| | |
|---|---|
| Argon flow | 75 sccm |
| Substrate voltage | −150 V |
| Current of low-voltage arc | 150 A |

Chromium Adhesion Layer

The deposition of the chromium adhesion layer is commenced by activating the chromium-magnetron sputter targets. The argon flow is set to, 115 sccm. The chromium sputter targets are operated at a power of 8 kW and the substrates are then rotated past the targets for a period of 6 minutes. The pressure that becomes established will lie between $10^{-3}$ and $10^{-4}$ mbar. The sputter process is supported by the switching on of the low-voltage arc and the application to the substrates of a negative direct biasing voltage of 75 V.

The low-voltage arc is switched off after half the chromium sputter time has elapsed and for the remainder of the chromium sputter time the deposition is continued only with the help of the active plasma in front of the targets.

Gradient Layer

After this time has elapsed, a plasma is ignited by switching on a sinusoidal oscillator. Acetylene is introduced into the chamber at an initial pressure of 50 sccm and the flow is then increased by 10 sccm each minute.

The sinusoidal plasma generator is set to an amplitude voltage of 2400 V at a frequency of 40 kHz. The generator ignites a plasma discharge between the substrate holders and the chamber wall. The Helmholtz coils attached to the recipient are both activated with a constant current throughput, the current amounting to 3 A in the lower coil and 10 A in the upper coil. The chromium target are deactivated when the argon flow reaches 230 sccm.

DLC Coating

When the acetylene flow reaches a value of 350 sccm, the argon flow is cut back to a value of 50 sccm.

The table below gives an overview of the parameters of i&s example.

| | |
|---|---|
| Argon flow | 50 sccm |
| Acetylene flow | 350 sccm |
| Excitation current in upper coil | 10 A |
| Excitation current in lower coil | 3 A |
| Voltage amplitude | 2400 V |
| Excitation frequency | 40 kHz |

These conditions assure a high deposition rate and the ionisation of the plasma is maintained with the help of the argon. The deposition rate that now becomes established in the coating process will be in the range between 0.5 and 4.0 μm/h, the precise value depending also on the areas that have to be coated in the process chamber.

At the end of the coating period the sinusoidal generator and the gas flow are switched off and the substrates are removed from the process chamber.

The properties of the resulting layer are summarized in the following table:

| Properties - Example 1 | |
|---|---|
| Microhardness | about 2200 HK |
| Deposition rate | 1–2 μm/h |
| Adhesion | HF1 |
| Resistance | <10 kΩ |
| Hydrogen content | 12% |
| Coefficient of friction | 0.2 |
| Internal stress | about 2 GPa |
| Fracture behaviour | Not glass-like |

Process Example 2

Process Example 2 involves a procedure similar to that of Example 1. In contrast with Example 1, however, the plasma is now produced by a pulse generator. The excitation frequency is of the order of 50 kHz with an amplitude voltage of 700 V.

The parameters of the example are set out in the following table:

| | |
|---|---|
| Argon flow | 50 sccm |
| Acetylene flow | 350 sccm |
| Excitation current in upper coil | 10 A |
| Excitation current in lower coil | 3 A |
| Voltage amplitude | 700 V |
| Excitation frequency f | 40 kHz |

The coating produced in this example has a hardness of 25 GPa, an adhesion of HF1, and a coefficient of friction of 0.2.

| Properties - Example 2 | |
|---|---|
| Microhardness | about 2400 HK |
| Deposition rate | about 1.5 μm/h |
| Adhesion | HF1 |
| Resistance | >500 kΩ |
| Hydrogen content | 13% |
| Coefficient of friction | 0.2 |
| Internal stress | about 2 GPa |

Process Example 3

Process Example 3 involves a procedure similar to that of Example 1. In contrast with Example 1, however, the plasma is now excited by a unipolar pulsed voltage.

The parameters of the example are set out in the following table:

| | |
|---|---|
| Argon flow | 50 sccm |
| Acetylene flow | 350 sccm |
| Excitation current in upper coil | 10 A |
| Excitation current in lower coil | 3 A |
| Voltage amplitude | 1150 V |
| Excitation frequency f | 30 kHz |

The coating produced in this example has the properties described in the following table:

| Properties - Example 3 | |
|---|---|
| Microhardness | >2400 HK |
| Deposition rate | about 1.8 µm/h |
| Adhesion | HF1 |
| Resistance | >1 kΩ |
| Hydrogen content | 12–16% |
| Coefficient of friction | 0.2 |
| Internal stress | about 2 GPa |

Process Example 4

As compared with Process Example 1, Example 4 involved a process without the support of a longitudinal magnetic field. The current flowing through the two coils was reduced to a value of 0 A. The process parameters are set out in the following table:

| | |
|---|---|
| Argon flow | 50 sccm |
| Acetylene flow | 350 sccm |
| Excitation current in upper coil | 0 A |
| Excitation current in lower coil | 0 A |
| Voltage amplitude | 2400 V |
| Excitation frequency f | 40 kHz |

As compared with Example 1, the plasma that becomes established in the chamber becomes stable only at higher pressures, is inhomogeneously distributed over the chamber and very strongly influenced by geometric effect. For this reason, the deposition rate in the process chamber is not homogeneous and—due to the set process pressure—it is also slower than in Example 1. At the desired process pressures it was not possible to obtain the formation of a plasma without the use of a second plasma source, a target for example, or the switching on of the filament. Only the use of the Helmholtz coils made it possible to stabilize the plasma in the process chamber and to obtain a homogeneous deposition over the height of the process chamber. Without the use of the coils, moreover, a plasma ignited in the region of the ionisation chamber, where high local temperatures are produced and one therefore has to fear destruction.

| Properties - Example 4 | |
|---|---|
| Microhardness | Inhomogeneous 1200–2500 HK |
| Deposition rate | Inhomogeneous |
| Adhesion | Inhomogeneous |
| Resistance | >1 kΩ |

Slipping Layer Systems

The subsequent process examples were use to apply different slipping to the DLC layers described above in order to produce layer systems in accordance with the invention. When this is done, care must be taken to ensure that the process, inclusive of all the preliminary treatments of the plasma and the coating steps, are carried out continuously and without interruption of the vacuum in order to obtain an optimal layer adhesion.

TABLE 5 sets out the details of the different process examples, each of which produced a graphitised slipping layer.

| | Process example | | |
|---|---|---|---|
| | 5 | 6 | 7 |
| DLC layer system, Example | as 1, but voltage amplitude 1000 V | as 2 | as 3 |
| Argon flow | 50 sccm | 50 sccm | 50 sccm |
| Acetylene flow | 350 sccm | 350 sccm | 350 sccm |
| Excitation current in upper coil | 10 A | 10 A | 10 A |
| Excitation current in lower coil | 3 A | 3 A | 3 A |
| Substrate voltage amplitude | 2400 V | 2400 V | 2400 V |
| Voltage ramp | 15 minutes | 25 minutes | 15 minutes |
| Excitation frequency f | 40 kHz | 40 kHz | 30 kHz |
| Excitation type | AC sinusoidal | bipolar pulse | Unipolar pulse |

TABLE 6 shows various possible ways of forming a slipping layer, for example a terminal gradient layer (No.8), an inverse gradient layer (No.9), or a hydrogen-rich carbon layer (No.10).

| | Process example | | |
|---|---|---|---|
| | 8 | 9 | 10 |
| DLC layer, No. | 1 | 2 | 2 |
| Argon flow 1 | 30 sccm | 50 sccm | 50 sccm |
| Argon flow 2 | 30 (100) sccm | — | — |
| Argon ramp | 0 (10) minutes | — | — |
| Acetylene flow 1 | 0 sccm | 350 sccm | 350 sccm |
| Acetylene flow 2 | 350 sccm | 350 sccm | 350 sccm |

TABLE 6-continued shows various possible ways of forming a slipping layer, for example a terminal gradient layer (No.8), an inverse gradient layer (No.9), or a hydrogen-rich carbon layer (No.10).

| | Process example | | |
|---|---|---|---|
| | 8 | 9 | 10 |
| Argon ramp | 15 minutes | 20 minutes | 20 minutes |
| Methane flow 1 | — | — | 0 sccm |
| Methane flow 2 | — | — | 150 sccm |
| Methane ramp | — | — | 20 minutes |
| Power chromium target 1 | 8 kW | 7 kW | — |
| Power chromium target 2 | 7 kW | — | — |
| Chromium target ramp | 20 minutes | 30 minutes | — |
| Excitation current upper coil | 10 A | 10 A | 10 A |
| Excitation current lower coil | 3 A | 3 A | 3 A |
| Substrate voltage amplitude | 2400 V | 700 V | 1150 V |
| Excitation frequency f | 40 kHz | 40 kHz | 30 kHz |
| Excitation type | AC sinusoidal | bipolar pulse | unipolar pulse |

*The acetylene ramp in this case may be commenced also 5–10 minutes after the chromium targets have been switched on. Such a procedure is particularly advantageous when the DLC layer and the slipping layer are deposited in different process chambers or coating plants. A direct voltage source may be used to apply the biasing voltage to the substrate in place of the sinusoidal generator.

Further, the graphite component can be increased by Co-sputtering of carbidic targets, possibly WC and/or graphite targets, which may be switched on either simultaneously or likewise with a time delay. If one wants to exploit the particularly favourable slipping properties of tungsten or tantalum layers or niobium/carbon layers, it will be advantageous to switch off the chromium targets after the formation of an adhesion and/or gradient layer or to step them down and complete the process only with the appropriate metal or metal carbide targets:

The properties of the resulting DLC layer are summarized in Tables 8 and 9 below.

TABLE 8

| | Test No. | | |
|---|---|---|---|
| | 5 | 6 | 7 |
| Adhesion | HF 1 | HF 1 | HF 1 |
| Resistance | <100 kΩ | <100 kΩ | <100 kΩ |
| Coefficient of friction | about 0.08 | about 0.07 | about 0.13 |

TABLE 9

| | Test No. | | |
|---|---|---|---|
| | 8 | 9 | 10 |
| Adhesion | HF 1 | HF 1 | HF 1 |
| Resistance | <1 kΩ | <1 kΩ | <100 kΩ |
| Hydrogen content | n.s. | n.s. | >30 atom % |
| Coefficient of friction | about 0.08 | about 0.07 | about 0.13 |

Features of a DLC Layer System

1. A layer system for wear protection, corrosion protection and improvement of the slipping properties and the like with an adhesion layer to be arranged on a substrate, a transition layer to be arranged on the adhesion layer and a covering layer of diamond-like carbon, characterized in that the adhesion layer comprises at least one element of the group that contains the elements of the fourth, fifth and sixth subgroups [of the periodic table] and silicon, the transition layer comprises carbon and at least one element of the group that contains the elements of the fourth, fifth and sixth subgroups and silicon, and the covering layer comprises essentially diamond-like carbon, where the layer system has a hardness of at least 15 GPa, preferably at least 20 GPa, and an adhesion of at least 3 HF.

2. A layer system in accordance with Feature 1, characterized in that the transition layer is a gradient layer that may be either a single layer or a multi-layer system and has a composition that changes either continuously or in steps and, more precisely, in such a manner that the carbon component increases in the direction away from the substrate, while the component of the at least one element of the group that contains the elements of the fourth, fifth and sixth subgroups and silicon diminishes.

3. A layer system in accordance with any one of the preceding features, characterized in that the covering layer has a greater thickness than either the adhesion layer or the transitions layer.

4. A layer system in accordance with any one of the preceding features, characterized in that the transition layer and/or the covering layer also comprises hydrogen and unavoidable pollutions, where the unavoidable pollutions comprise inert gases, especially argon and xenon.

5. A layer system in accordance with Feature 4, characterized in that the covering layer contains either exclusively carbon or carbon and hydrogen.

6. A layer system in accordance with Feature 4, characterized in that the covering layer has a hydrogen content of from 4 to 30 atom %, preferably 10 to 20 atom %.

7. A layer system in accordance with any one of the preceding features, characterized in that the at least one element of the group that comprises the elements of the fourth, fifth and sixth subgroup is titanium and/or chromium.

8. A layer system in accordance with any one of the preceding features, characterized in that both the adhesion layer and the transition layer have a thickness of from 0.05 μm to 1.5 μm, preferably from 0.1 μm to 0.8 μm.

9. A layer system in accordance with any one of the preceding features, characterized in that covering layer has thickness of from 0.5 µm to 20 µm, preferably from 1.0 µm to 10 µm.

10. A layer system in accordance with any one of the preceding features, characterized in that the covering layer consisting of diamond-like carbon has a fine-gained layer structure.

11. A process for the production on a substrate of a layer system, especially a layer system in accordance with any one of Features 1 to 10, characterized in that the process comprises:
 a) introducing the substrate into a vacuum chamber and evacuating the chamber until a pressure of less than $10^{-4}$ mbar, preferably less than $10^{-5}$ mbar, is attained,
 b) cleaning the substrate surface,
 c) plasma-supported deposition of the adhesion layer on the substrate,
 d) depositing the transition layer on the adhesion layer by the simultaneous plasma-supported deposition of the adhesion layer component and deposition of carbon from the gaseous phase,
 e) application of a diamond-like covering layer on the transition layer by means of plasma-supported deposition of carbon from the gaseous phase,
 wherein a substrate biasing voltage is applied to the substrate at least during process steps c(, d) and e) and the plasma is stabilized by means of a magnetic field at least during process steps d) and e).

12 A process in accordance with Feature 11, characterized in that the cleaning of the substrate surface comprises a heating step and/or an etching step.

13. A process in accordance with Feature 12, characterized in that the heating step consists of radiation heating, inductive heating and/or bombardment with electrons.

14. A process in accordance with Feature 13, characterized in that the electron bombardment is effected by igniting a low-voltage arc and the simultaneous application of a substrate biasing voltage that may be continuous, AC or AC-superposed, especially a pulsed positive substrate biasing voltage.

15. A process in accordance with Feature 10, characterized in that the etching step is carried out by means of ion etching, wherein a low-voltage arc is ignited with an inert gas, preferably argon, and/or hydrogen as process gas and a continuous negative biasing voltage is applied to the substrate.

16. A process in accordance with Feature 10, characterized in that the etching step is carried out by means of ion etching with an inert gas, preferably argon, and/or hydrogen as process gas, wherein an AC or AC-superposed biasing voltage, especially a pulsed biasing voltage, preferably of medium frequency, is applied to the substrate.

17. A process in accordance with any one of Features 10 to 16, characterized in that the deposition of the adhesion layer is carried out by means of Plasma-CVD processes, PVD processes, especially arc vaporization, ion plating processes or cathodic sputtering.

18. A process in accordance with Feature 17, characterized in that the deposition of the adhesion layer is supported by an additional low-voltage arch discharge and that a negative biasing voltage is applied to the substrate.

19. A process in accordance with Feature 17, characterized in that the deposition of the adhesion layer is supported by an additional pulsed substrate biasing voltage, which may be an AC or AC-superposed biasing voltage, especially a pulsed substrate biasing voltage in the middle-frequency range between 1 and 20,000 kHz, preferably between 20 and 250 kHz.

20. A process in accordance with any one of Features 10 to 19, characterized in that an inert gas or an inert gas/hydrogen mixture, preferably an argon/hydrogen mixture, is introduced into the vacuum chamber for the ignition of a plasma.

21. A process in accordance with any one of Features 10 to 20, characterized in that the transition layer is formed by the simultaneous deposition of at least one element of the group that contains the elements of the fourth, fifth and sixth subgroup and silicon by means of a process in accordance with any one of Features 17 to 20 and plasma-supported deposition of carbon from the gaseous phase, wherein a carbon-containing gas, preferably a hydrocarbon gas, especially acetylene, is used as an additional reaction gas.

22. A process in accordance with Feature 21, characterized in that the percentage share of the carbon deposition is increased, either continuously or in steps, as the thickness of the transition layer increases.

23. A process in accordance with any one of Features 10 to 22, characterized in that the diamond-like carbon layer that constitutes the covering layer is produced by means of plasma-CVD deposition of carbon from the gaseous phase, a carbon-containing gas, preferably a hydrocarbon gas, especially acetylene, being used as reaction gas.

24. A process in accordance with any one of Features 21 or 23, characterized in that the reaction gas for the deposition of carbon comprises not only the carbon-containing gas, but also hydrogen and/or inert gas, preferably argon and/or xenon.

25 A process in accordance with Feature 24, characterized in that the percentage share of the carbon-containing gas is increased and/or the percentage share of the inert gas, especially argon, is reduced during the deposition of the covering layer.

26. A process in accordance with any one of Features 21 to 25, characterized in that the a unipolar or bipolar biasing voltage pulsed in the middle-frequency range from 1 to 10,000 kHz, preferably from 20 to 250 kHz, is applied to the substrate 27. A process in accordance with Feature 26, characterized in that the substrate biasing voltage is pulsed either sinusoidally or in such manner as to apply long negative and short positive pulse signals or large negative and small positive amplitudes.

28. A process in accordance with any one of Features 10 to 27, characterized in that a longitudinal magnetic field with a uniform field line pattern is superposed on the substrate during the cleaning and/or the application of the adhesion layer and/or the transition layer and/or the covering layer of diamond-like carbon, where the magnetic field is capable of being varied in time and/or in space either continuously or in steps.

29. A process in accordance with any one of Features 10 to 28, characterized in that the deposition of the adhesion layer and/or the transition layer and/or the covering layer of diamond-like carbon is carried out at a pressure of from $10^{-4}$ to $10^{-5}$ mbar.

30. A device for coating one or more substrates, especially for carrying out the coating process in accordance with any one of Features 10 to 29, with a vacuum chamber (1) with a pumping system (9) for the production of a vacuum in the vacuum chamber, substrate holder devices (3) to receive the substrates to be coated, at least one gas supply unit (8) for dosing the supply of process gas, at least one vaporizer device (14) to make available coating material for deposition, an arc generation device (10, 13) to ignite a low-voltage d.c. arc, a device (16) for the generation of a substrate biasing voltage and with at least one or several magnetic field generator devices (17) for the formation of a far magnetic field.

31. A device in accordance with Feature 30, characterized in that the magnetic field generator device (17) consists of at least one Helmholtz coil.

32. A device in accordance with Feature 31, characterized in that the Helmholtz coil can be regulated as regards the magnetic flux density it can produce.

33. A device in accordance with any one of Features 30 to 32, characterized in that the device for the generation of a substrate biasing voltage is so designed that the substrate biasing voltage can be varied either continuously or in steps as regards both its sign and its magnitude and/or can be rendered either unipolar or bipolar with a frequency in the medium-frequency range.

34. A device in accordance with any one of Features 30 to 33, characterized in that the vaporizer device (14) comprises sputter target, especially magnetron sputter targets, arc sources, thermal vaporizers and the like.

35. A device in accordance with any one of Features 30 to 34, characterized in that the vaporizer device (14) can be separated from the remainder of the process chamber (1).

36. A device in accordance with any one of Features 30 to 35, characterized in that the device also comprises substrate heating in the form in the form of inductive heating, radiation heating and the like.

37 A device in accordance with any one of Features 30 to 36, characterized in that the arc generator device (10, 13) comprises an ion source (10) and an anode (13), as well as a direct voltage supply (11), where the ion source (10) is connected to the negative pole of the direct current supply (11).

38. A device in accordance with Features 37, characterized in that the positive pole of the direct voltage supply (11) may be selectably connected to the anode (13) or the substrate holder devices (3).

39, A device in accordance with any one of Features 37 or 38, characterized in that the ion sources (10) comprises a filament, preferably a refractory filament, especially of tungsten, tantalum or similar, that is arranged within an ionization chamber and can be separated by means of a shield, preferably a refractory shield, especially of tungsten, tantalum or similar, from the process chamber (1).

40. A device in accordance with any one of Features 30 to 39, characterized in that the substrate holder devices (3) are mobile and preferably can rotate about at least one or more axes.

41. A device in accordance with any one of Features 30 to 40, characterized in that additional permanent magnets (20) are provided for the production of a near magnetic field.

42. A device in accordance with any one of Features 30 to 32, characterized in that the additional permanent magnets are arranged in a ring around the vacuum chamber (1), preferably with an alternating pole orientation, and are especially designed as magnetron electron traps.

| List of reference numbers |
|---|
| 1 Process chamber |
| 2 Parts to be coated |
| 3 Substrate holder device |
| 4 Simple rotation |
| 5 Double rotation |
| 6 Plant axis |
| 7 Rotating stage |
| 8 Gas inlet |
| 9 Pump set |
| 10 Ion sources |
| 11 Direct voltage supply |
| 12 Switch |
| 13 Auxiliary anode |
| 14 Vaporizer source |
| 15 Low-voltage arc |
| 16 Voltage supply |
| 17 Electromagnetic coil |
| 18 MF plasma |
| 19 Side wall |
| 20 Magnet systems |
| 21 Near fields |
| 22 Magnetron magnet fields |

The invention claimed is:

1. An improved layer system comprising:
    a substrate;
    an adhesion layer arranged on said substrate;
    a transition layer including carbon and at least one element of a group of elements that constitute the adhesion layer wherein said transition layer is arranged on said adhesion layer;
    one of a DLC and diamond layer arranged on said transition layer; and
    a slipping layer arranged on said one of a DLC and diamond layer, said slipping layer having a chemical composition different than a chemical composition layer of said one of a DLC or diamond layer.

2. A layer system in accordance with claim 1, wherein the percentage share of $sp^2$ bonds and/or the $sp^2/sp^3$ ratio in the slipping layer is greater than in the DLC or diamond layer.

3. A layer system in accordance with claim 2, wherein the change of the ratio and/or the increase of the hydrogen content over the thickness of the slipping layer takes place either continuously or in steps.

4. A layer system in accordance with claim 3, wherein the DLC or diamond layer is followed by at first a layer with a high metal content and then by a layer with a metal content which decreases in a direction of thickness and a carbon content which increases in the thickness direction.

5. A layer system in accordance with claim 2, wherein the DLC or diamond layer of diamond-like carbon has a fine-grained layer structure or consists of nanocrystalline diamond.

6. A layer system in accordance with claim 1, wherein the hydrogen content of the slipping layer is greater than the hydrogen content of the DLC or diamond layer and that its carbon content is smaller.

7. A layer system in accordance with claim 6, characterized in that the slipping layer has a hydrogen content of from 20 to 50 atom %.

8. The system according to claim 7, wherein said hydrogen content is from 30 to 50 atom %.

9. A layer system in accordance with claim 1, wherein a metal content of the slipping layer is greater than a metal content of the DLC or diamond layer.

10. A layer system in accordance with claim 1, wherein a metal content of the slipping layers increases in steps continuously, while the carbon content diminishes.

11. A layer system in accordance with claim 1, wherein a region of constant chemical composition is arranged in the part of the slipping layer close to the surface.

12. A layer system in accordance with claim 1, wherein the coefficient of friction of the surface of the slipping layer is smaller than $\mu=1.5$ and that the adhesion of the layer system is better than 3 HF.

13. The system according to claim 12, wherein an adhesion of he layer stem is better than 2HF.

14. The system according to claim 12, wherein the coefficient of friction is less than 1.0.

15. A layer system in accordance with claim 1, wherein the thickness of the transition layer amounts to between 5 to 60% of the total thickness.

16. The system according to claim 15, wherein the thickness of the transition layer is between 10 and 50% of the total thickness.

17. Layer systems in accordance with claim 1, wherein at least one of the adhesion layer, the transition layer, the DLC the diamond layer and the slipping layer comprises at least one of hydrogen and unavoidable impurities, while the unavoidable impurities comprise at least one inert gas.

18. The system according to claim 17, wherein the inert gases are at least one of argon and xenon.

19. A layer system in accordance with claim 1, wherein the DLC or diamond layer has a thickness of from 0.05 µm to 10 µm.

20. The layer system according to claim 19, wherein the thickness is from 0.5 to 5 microns.

21. A layer system in accordance with claim 1, wherein the slipping layer is applied on a DLC layer system.

22. A process for the production on a substrate of a layer system, especially a layer system in accordance with claim 1, wherein the process comprises the following process steps:
 a) introducing the substrate into a vacuum chamber and evacuating the chamber until a pressure of less than $10^{-3}$ mbar is attained,
 b) cleaning the substrate surface,
 c) plasma-supported deposition of the adhesion layer on the substrate,
 d) depositing the transition layer on the adhesion layer by the simultaneous plasma-supported deposition of the adhesion layer component and deposition of carbon from the gaseous phase,
wherein a substrate biasing voltage is applied to the substrate at least during process steps c), d), e) and f) and the plasma is stabilized by means of a magnetic field at least during process steps d) and e).

23. A process in accordance with claim 22, wherein at least during one of process steps b) to f) a bipolar or unipolar biasing voltage is applied to the substrate, where said biasing voltage, which may be sinusoidal or of some other shape, is pulsed in the medium-frequency range between 1 and 10,000 kHz.

24. The process according to claim 23, wherein the medium-frequency range is between 20 and 250 kHz.

25. A process in accordance with claim 22, wherein at least during one of process steps b) to f), there is applied a longitudinal magnetic field with a uniform field line pattern that envelops the substrates and is capable of being varied in time and/or in space either continuously on in steps.

26. A process in accordance with claim 22, wherein the transition layer and the slipping layer are formed by the simultaneous deposition of at least one element of the group of elements that contains the elements of the fourth, fifth and sixth subgroup and silicon by means plasma-supported deposition of carbon from the gaseous phase; where a carbon-containing gas, is used as reaction gas.

27. The process according to claim 26, wherein the carbon-containing gas is a hydrocarbon gas.

28. The process according to claim 26, wherein the carbon containing gas is acetylene.

29. A process in accordance with claim 22, wherein for the purposes of applying the slipping layer a metal-containing layer is first deposited on the DLC or diamond layer and that the percentage share of the carbon deposition is increased in the direction of the thickness of the metal-containing layer either continuously or in steps as the thickness of the slipping layer increases.

30. A process in accordance with claim 22, wherein the percentage share of the carbon deposition is diminished in the direction of the surface either continuously or in steps as the thickness of the slipping layer increases and the percentage share of a metal or hydrogen deposition is increased.

31. A process in accordance with claim 22, wherein the DLC or diamond layer is produced by plasma-CVD deposition or carbon from the gaseous phase, where a carbon-containing gas is used as reaction gas.

32. A process in accordance with claim 22, characterized in that process step b) to f) are carried out at a pressure of $10^{-4}$ mbar to $10^{-2}$ mbar.

33. A device for coating one or more substrates for carrying out the coating process in accordance with claim 22, with a vacuum chamber with a pumping system for the production of a vacuum in a vacuum chamber, substrate holding devices to receive the substrates to be coated, at least one gas supply unit for dosing the supply of process gas, at least one vaporizer device to make available coating materials for deposition, an arc generation device to ignite a low-voltage d.c. arc, a device for the generation of a substrate biasing voltage and with at least one or several magnetic field generator devices for the formation of a far magnetic field, wherein the device for the production of a substrate biasing voltage is so designed that the substrate biasing voltage can be varied either continuously or in steps as regards both its sign and its magnitude and/or can be rendered either unipolar or bipolar with a frequency in the medium-frequency range.

34. A device in accordance with claim 33, characterized in that the magnetic field generator device for the formation of a far magnetic field comprises at least two electromagnetic coils, each of which laterally envelops one of two magnetron devices arranged opposite each other, wherein the polarities of the opposite magnetron magnet systems are so oriented that the North pole of one system faces a South pole of the other system and that the coils associated with each system are simultaneously connected to a current source in such a manner that the fields of the magnetic coils complement each other into a closed magnetic field and the polarity of the outer poles of the magnetron magnet systems and the magnetic coils act in the same direction.

35. The process according to claim 22, wherein the pressure is less than $10^{-5}$ mbar.

* * * * *